US012764961B2

(12) United States Patent
Takekida et al.

(10) Patent No.: US 12,764,961 B2
(45) Date of Patent: Oct. 13, 2026

(54) SEMICONDUCTOR DEVICE WITH REDUCED AREA AND METHOD OF MANUFACTURING THE SAME

(71) Applicant: Kioxia Corporation, Tokyo (JP)

(72) Inventors: Hideto Takekida, Nagoya Aichi (JP); Junichi Shibata, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 617 days.

(21) Appl. No.: 18/168,828

(22) Filed: Feb. 14, 2023

(65) Prior Publication Data

US 2023/0413566 A1 Dec. 21, 2023

(30) Foreign Application Priority Data

Jun. 20, 2022 (JP) ................................ 2022-099096

(51) Int. Cl.

| | |
|---|---|
| ***H10B 43/35*** | (2023.01) |
| ***H10B 41/27*** | (2023.01) |
| ***H10B 41/35*** | (2023.01) |
| ***H10B 43/27*** | (2023.01) |
| ***H10W 20/41*** | (2026.01) |
| ***H10W 20/42*** | (2026.01) |

(52) U.S. Cl.

CPC ............ *H10B 43/35* (2023.02); *H10B 41/27* (2023.02); *H10B 41/35* (2023.02); *H10B 43/27* (2023.02); *H10W 20/42* (2026.01); *H10W 20/435* (2026.01)

(58) Field of Classification Search

CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | | |
|---|---|---|---|---|
| 7,479,673 | B2 | 1/2009 | Jang et al. | |
| 8,476,708 | B2 | 7/2013 | Fukuzumi et al. | |
| 9,202,925 | B2 | 12/2015 | Yamazaki et al. | |
| 10,283,493 | B1 * | 5/2019 | Nishida | H01L 25/0657 |
| 11,049,870 | B2 | 6/2021 | Sugisaki | |
| 11,170,855 | B2 | 11/2021 | Itano et al. | |

(Continued)

FOREIGN PATENT DOCUMENTS

| | | |
|---|---|---|
| JP | 2005203777 A | 7/2005 |
| JP | 2012146861 A | 8/2012 |

(Continued)

*Primary Examiner* — William B Partridge
*Assistant Examiner* — Gustavo G Ramallo
(74) *Attorney, Agent, or Firm* — Maier & Maier, PLLC

(57) ABSTRACT

In one embodiment, a semiconductor device includes a first substrate, a first transistor provided on an upper face of the first substrate, and a memory cell array provided above the first transistor. The device further includes a second substrate provided above the memory cell array, and a second transistor provided on an upper face of the second substrate.

20 Claims, 18 Drawing Sheets

(56) References Cited

U.S. PATENT DOCUMENTS

| | | | |
|---|---|---|---|
| 11,935,596 | B2 | 3/2024 | Wang et al. |
| 2020/0098776 | A1 | 3/2020 | Sugisaki |
| 2021/0082877 | A1 * | 3/2021 | Uchiyama ............. H10W 90/00 |
| 2021/0375901 | A1 | 12/2021 | Oh et al. |
| 2022/0102334 | A1 * | 3/2022 | Kim ....................... H10B 41/35 |
| 2022/0130846 | A1 | 4/2022 | Kim et al. |
| 2022/0399362 | A1 * | 12/2022 | Mizutani ............. H01L 23/5283 |

FOREIGN PATENT DOCUMENTS

| | | | |
|---|---|---|---|
| JP | 2015005733 | A | 1/2015 |
| JP | 202047814 | A | 3/2020 |
| JP | 2021044358 | A | 3/2021 |
| JP | 2024500456 | A | 1/2024 |
| WO | 2023272556 | A1 | 1/2023 |

* cited by examiner

SEMICONDUCTOR DEVICE WITH REDUCED AREA AND METHOD OF MANUFACTURING THE SAME

CROSS-REFERENCE TO RELATED APPLICATIONS

This application is based upon and claims the benefit of priority from the prior Japanese Patent Application No. 2022-099096, filed on Jun. 20, 2022, the entire contents of which are incorporated herein by reference.

FIELD

Embodiments described herein relates to a semiconductor device and a method of manufacturing the same.

BACKGROUND

The area of a semiconductor chip of a three-dimensional memory can be reduced, for example, by reducing the area of a memory cell array. However, unless the area of a CMOS circuit is reduced together with the area of the memory cell array, the area of the semiconductor chip might be determined by the area of the CMOS circuit.

DETAILED DESCRIPTION

Embodiments will now be explained with reference to the accompanying drawings. In FIGS. 1 to 18, the same components are denoted by the same reference signs, and redundant description thereof will be omitted.

In one embodiment, a semiconductor device includes a first substrate, a first transistor provided on an upper face of the first substrate, and a memory cell array provided above the first transistor. The device further includes a second substrate provided above the memory cell array, and a second transistor provided on an upper face of the second substrate.

First Embodiment

Figure 1:
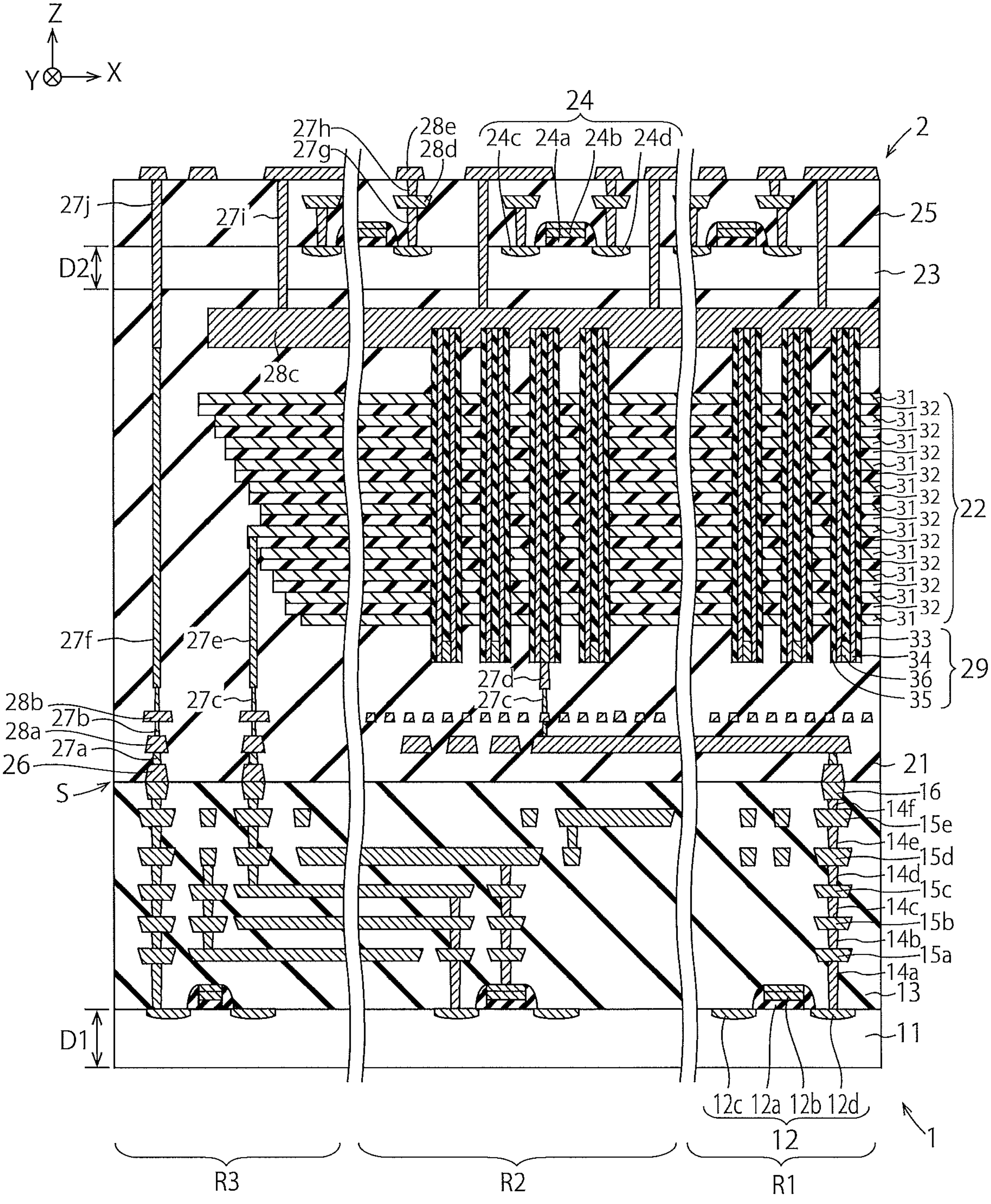
FIG. 1 is a sectional view showing a structure of a semiconductor device of a first embodiment.

FIG. 1 is a sectional view showing a structure of a semiconductor device of a first embodiment.

The semiconductor device of the present embodiment is, for example, a semiconductor chip including a three-dimensional memory. As described later, the semiconductor device of the present embodiment is produced by bonding a circuit wafer including a circuit chip 1 and an array wafer including an array chip 2. FIG. 1 shows a bonding face S between the circuit chip 1 and the array chip 2.

In FIG. 1, the array chip 2 includes a memory cell array containing plural memory cells while the circuit chip 1 includes a CMOS circuit adapted to control operations of the memory cell array. However, as described later, the CMOS circuit of the present embodiment is contained not only in the circuit chip 1, but also in the array chip 2.

The circuit chip 1 includes a substrate 11, plural transistors 12, an inter layer dielectric 13, plural plugs 14*a* to 14*f*, plural interconnect layers to 15*e*, and plural metal pads 16. The substrate 11 is an example of a first substrate and each of the transistors 12 is an example of a first transistor. Each of the transistors 12 includes a gate insulator 12*a*, a gate electrode 12*b*, a diffusion layer 12*c*, and a diffusion layer 12*d*.

The array chip 2 includes an inter layer dielectric 21, a stacked film 22, a substrate 23, plural transistors 24, an inter layer dielectric 25, plural metal pads 26, plural plugs 27*a* to 27*j*, plural interconnect layers 28*a* to 28*e*, and columnar portions 29. The substrate 23 is an example of a second substrate and each of the transistors 24 is an example of a second transistor. Each of the transistors 24 includes a gate insulator 24*a*, a gate electrode 24*b*, a diffusion layer 24*c*, and a diffusion layer 24*d*. The stacked film 22 includes plural electrode layers 31 and plural insulators 32. Each of the columnar portions 29 includes a memory insulator 33, a channel semiconductor layer 34, a core insulator 35, and a core semiconductor layer 36.

The substrate 11 is, for example, a semiconductor substrate such as a Si (silicon) substrate. FIG. 1 shows an X direction and Y direction perpendicular to each other and parallel to a surface of the substrate 11 as well as shows a Z direction perpendicular to a surface of the substrate 11. The X direction, the Y direction, and the Z direction intersect one another. Hereinafter, a +Z direction is treated as an upward direction and −Z direction is treated as a downward direction. The −Z direction may or may not coincide with the gravity direction. FIG. 1 further shows a thickness D1 of the substrate 11.

Each of the transistors 12 includes the gate insulator 12*a* and the gate electrode 12*b* formed in order on the substrate 11 as well as the diffusion layers 12*c* and 12*d* formed in the substrate 11. One of the diffusion layers 12*c* and 12*d* functions as a source region and the other of the diffusion layers 12*c* and 12*d* functions as a drain region. The circuit chip 1 includes plural transistors 12 on an upper face of the substrate 11 and the transistors 12 make up, for example, the CMOS circuit described above. The transistors 12 include, for example, LV (low-voltage) transistors whose gate insulators 12*a* have a small thickness and/or HV (high-voltage) transistors whose gate insulators 12*a* have a large thickness. According to the present embodiment, desirably the transistors 12 include the LV transistors and HV transistors, or include only the LV transistors. The small thickness is an example of a first thickness and the large thickness is an example of a second thickness.

FIG. 1 includes regions R1, R2, and R3 in or on the substrate 11. The transistors 12 in the region R1 make up, for example, a sense amplifier (S/A). The transistors 12 in the region R2 function, for example, as word line switches (WLSWs). The transistors 12 in the region R3 are, for example, other transistors 12 in the CMOS circuit described above.

The inter layer dielectric 13 is formed on the substrate 11, covering the transistors 12. The inter layer dielectric 13 is, for example, a stacked film that includes a $SiO_2$ film (silicon oxide film) and other insulators.

The plugs 14*a* to 14*f* and the interconnect layers 15*a* to 15*e* are formed on the substrate 11 and the transistors 12 in the order: the plug 14*a*, the interconnect layer 15*a*, the plug 14*b*, the interconnect layer 15*b*, the plug 14*c*, the interconnect layer 15*c*, the plug 14*d*, the interconnect layer 15*d*, the plug 14*e*, the interconnect layer 15*e*, and the plug 14*f*. The plug 14*a* corresponds to a contact plug and the plugs 14*b* to 14*f* correspond to via plugs. Each of the interconnect layers 15*a* to 15*e* includes plural interconnects in the interconnect layer. The plugs 14*a* to 14*f* and the interconnect layers 15*a* to 15*e* are provided in the inter layer dielectric 13.

The plural metal pads 16 are placed on the plug 14*f* in the inter layer dielectric 13. The metal pads 16 and the inter layer dielectric 13 form an upper face of the circuit chip 1 and placed in contact with a lower face of the array chip 2. Each of the metal pads 16 includes, for example, a Cu (copper) layer.

The inter layer dielectric 21 is formed on the inter layer dielectric 13. The inter layer dielectric 21 is a stacked film that includes, for example, a $SiO_2$ film and other insulators.

The stacked film 22 includes plural electrode layers 31 and plural insulators 32 provided alternately in the inter layer dielectric 21. The electrode layers 31 are spaced away from one another in the Z direction. The electrode layers 31 include, for example, plural word lines and plural selection lines. Each of the electrode layers 31 is, for example, a metal layer including a W (tungsten) layer. Each of the insulators 32 is, for example, a $SiO_2$ film. The stacked film 22 makes up a memory cell array, together with the columnar portions 29 and the like.

The substrate 23 is placed on the inter layer dielectric 21 and located above the stacked film 22. The substrate 23 is, for example, a semiconductor substrate such as a Si substrate. FIG. 1 further shows a thickness D2 of the substrate 23.

Each of the transistors 24 includes the gate insulator 24*a* and gate electrode 24*b* formed in order on the substrate 23, as well as the diffusion layers 24*c* and 24*d* formed in the substrate 23. One of the diffusion layers 24*c* and 24*d* functions as a source region and the other of the diffusion layers 24*c* and 24*d* functions as a drain region. The array chip 2 includes plural transistors 24 on an upper face of the substrate 23 and the transistors 24 make up, for example, the CMOS circuit described above. The transistors 24 include, for example, LV transistors whose gate insulators 24*a* have the small thickness and/or HV transistors whose gate insulators 24*a* have the large thickness. According to the present embodiment, desirably the transistors 24 include only the HV transistors. As described above, according to the present embodiment, the CMOS circuit is made up of the transistors 12 and the transistors 24.

In FIG. 1, the thickness D2 of the substrate 23 is set smaller than the thickness D1 of the substrate 11. This has an advantage, for example, of making it easy to form plugs that penetrate the substrate 23. On the other hand, when the transistors 12 include only LV transistors and the transistors 24 include only HV transistors, the thickness D2 of the substrate 23 may be set larger than the thickness D1 of the substrate 11. This makes it possible to reduce the thickness D1 of the substrate 11 on which only LV transistors whose depletion layer is less stretchable are provide and increase the thickness D2 of the substrate 23 on which only HV transistors whose depletion layer is stretchable are provided. This in turn makes it possible, for example, both to downsize the semiconductor device by reducing the thickness of the substrate 11 and to deal with a depletion layer suitably by increasing the thickness of the substrate 23. When the thickness D2 of the substrate 23 is larger than the thickness D1 of the substrate 11, the thickness D2 of the substrate 23 is, for example, 10 μm or above.

The inter layer dielectric 25 is formed on the substrate 23, covering the transistors 24. The inter layer dielectric 25 is a stacked film that includes, for example, a $SiO_2$ film and other insulators.

The plural metal pads 26 are placed on the metal pads 16 in the inter layer dielectric 21. The metal pads 26 and the inter layer dielectric 21 form the lower face of the array chip 2 by being placed in contact with the upper face of the circuit chip 1. Each of the metal pads 26 includes, for example, a Cu (copper) layer.

The plugs 27*a* to 27*c* and the interconnect layers 28*a* and 28*b* are formed on the metal pads 26 in the inter layer dielectric 21 in the order: the plug 27*a*, the interconnect layer 28*a*, the plug 27*b*, the interconnect layer 28*b*, and the plug 27*c*. The plugs 27*a* to 27*c* correspond to via plugs. Each of the interconnect layers 28*a* and 28*b* includes plural interconnects in the interconnect layer. The interconnect layer 28*b* in the regions R1 and R2 includes plural interconnects extending in the Y direction, and the interconnects correspond to bit lines.

The plugs 27*d* to 27*f* and the interconnect layer 28*c* are also formed in the inter layer dielectric 21. The plug 27*d* is provided on the plug 27*c*, but under the core semiconductor layer 36 in the columnar portion 29. The plug 27*e* is provided on the plug 27*c*, but under the electrode layers 31 in the stacked film 22. The plug 27*f* is provided on the plug 27*c*, but under the plug 27*j*. The plugs 27*d* to 27*f* correspond to contact plugs. In FIG. 1, one interconnect (source line) in the interconnect layer 28*c* is provided on the plural columnar portions 29.

The plugs 27*g* and 27*h* and the interconnect layer 28*d* are formed on the substrate 23 and the transistors 24 in the inter layer dielectric 25 in the order: the plug 27*g*, the interconnect layer 28*d*, and the plug 27*h*. The interconnect layer 28*e* is formed on the inter layer dielectric 25 and the plug 27*h*. The plug 27*g* corresponds to a contact plug and the plug 27*h* corresponds to a via plug. Each of the interconnect layers 28*d* and 28*e* includes plural interconnects in the interconnect layer. At least some of the interconnects in the interconnect layer 28*e* function as bonding pads for use to electrically connect the semiconductor device of the present embodiment with another device. The interconnect layer 28*e* may be partially covered with a non-illustrated passivation insulator.

The plugs 27*i* and 27*j* are formed in the inter layer dielectric 21, the substrate 23, and the inter layer dielectric 25 by penetrating the substrate 23. The plug 27*i* is provided on the interconnect layer 28*c*, but under the interconnect layer 28*e*. In FIG. 1, the plug 27*i* is electrically connected with the channel semiconductor layer 34 in the columnar portions 29 via the interconnect layer 28*c*. The plug 27*j* is provided on the plug 27*f*, but under the interconnect layer 28*e*. In FIG. 1, the plug 27*j* is electrically connected with the diffusion layers 12*c* or 12*d* of the transistors 12 in the region R3. The plug 27*j* may be electrically connected with the gate electrodes 12*b* of the transistors 12 in the region R3. The plug 27*i* corresponds to a contact plug and the plug 27*j* corresponds to a via plug. Each of the plugs 27*i* and 27*j* of the present embodiment is electrically insulated from the substrate 23 by a non-illustrated insulator. The plugs 27*i* and 27*j* are examples of a second plug.

Each of the columnar portions 29 is formed in the stacked film 22 and has a columnar shape extending in the Z direction. Each of the columnar portions 29 includes the memory insulator 33, the channel semiconductor layer 34, the core insulator 35, and the core semiconductor layer 36, which are provided in the stacked film 22 in order, where the core semiconductor layer 36 is provided under the core insulator 35. The channel semiconductor layer 34 is, for example, a polysilicon layer. The core insulator 35 is, for example, a $SiO_2$ film. The core semiconductor layer 36 is, for example, a polysilicon layer. The core semiconductor layer 36 is electrically connected with the channel semiconductor layer 34. The channel semiconductor layer 34 is electrically connected with an interconnect (source line) in the interconnect layer 28*c* and the core semiconductor layer 36 is electrically connected with an interconnect (bit line) in the interconnect layer 28*b* via the plugs 27*d* and 27*c*.

The area of the semiconductor device (semiconductor chip) of the present embodiment can be reduced, for example, by reducing the area of the memory cell array. The area of the memory cell array is generally determined by the area of the stacked film 22. However, unless the area of a CMOS circuit is reduced together with the area of the memory cell array, the area of the semiconductor device of the present embodiment might be determined by the area of the CMOS circuit.

Consequently, the CMOS circuit of the present embodiment is made up of the transistors 12 on the substrate 11 and the transistors 24 on the substrate 23. For example, if a CMOS circuit is made up of M+N transistors 12 on the substrate 11, the area of the CMOS circuit on the substrate 11 generally depends on the value of M+N. On the other hand, if the CMOS circuit is made up of M transistors 12 on the substrate 11 and N transistors 24 on the substrate 23, the area of the CMOS circuit on the substrate 11 generally depends on the value of M and the area of the CMOS circuit on the substrate 23 generally depends on the value of N. In these cases, if the area of the semiconductor device is determined by the area of the CMOS circuit, the area of the semiconductor device in the former case generally depends on the value of M+N and the area of the semiconductor device in the latter case generally depends on the value of M or N, whichever is larger. When M=N, the area of the semiconductor device in the former case generally depends on the value of 2N and the area of the semiconductor device in the latter case generally depends on the value of N, and the area in the latter case is half the area in the former case. Therefore, according to the present embodiment, by constructing the CMOS circuit from transistors 12 and 24, it is possible reduce the area of the semiconductor device.

When the area of the CMOS circuit on the substrate 11 or the area of the CMOS circuit on the substrate 23 is reduced, the area of the semiconductor device may sometimes be determined by the area of the memory cell array again. Even in this case, the effect described above is available. For example, if the area of the memory cell array is 1.5N, in the former case in which “the area of the CMOS circuit on the substrate 11” is 2N, “the area of the semiconductor device” is 2N, and in the latter case in which both “the area of the CMOS circuit on the substrate 11” and “the area of the CMOS circuit on the substrate 23” are N, “the area of the semiconductor device” is 1.5 N.

Whereas the semiconductor device of the present embodiment includes one circuit chip 1 and one array chip 2, alternatively, the semiconductor device may include one circuit chip 1 and two or more array chips 2. In that case, the transistors making up the CMOS circuit may be placed on three or more substrates.

Figure 2:
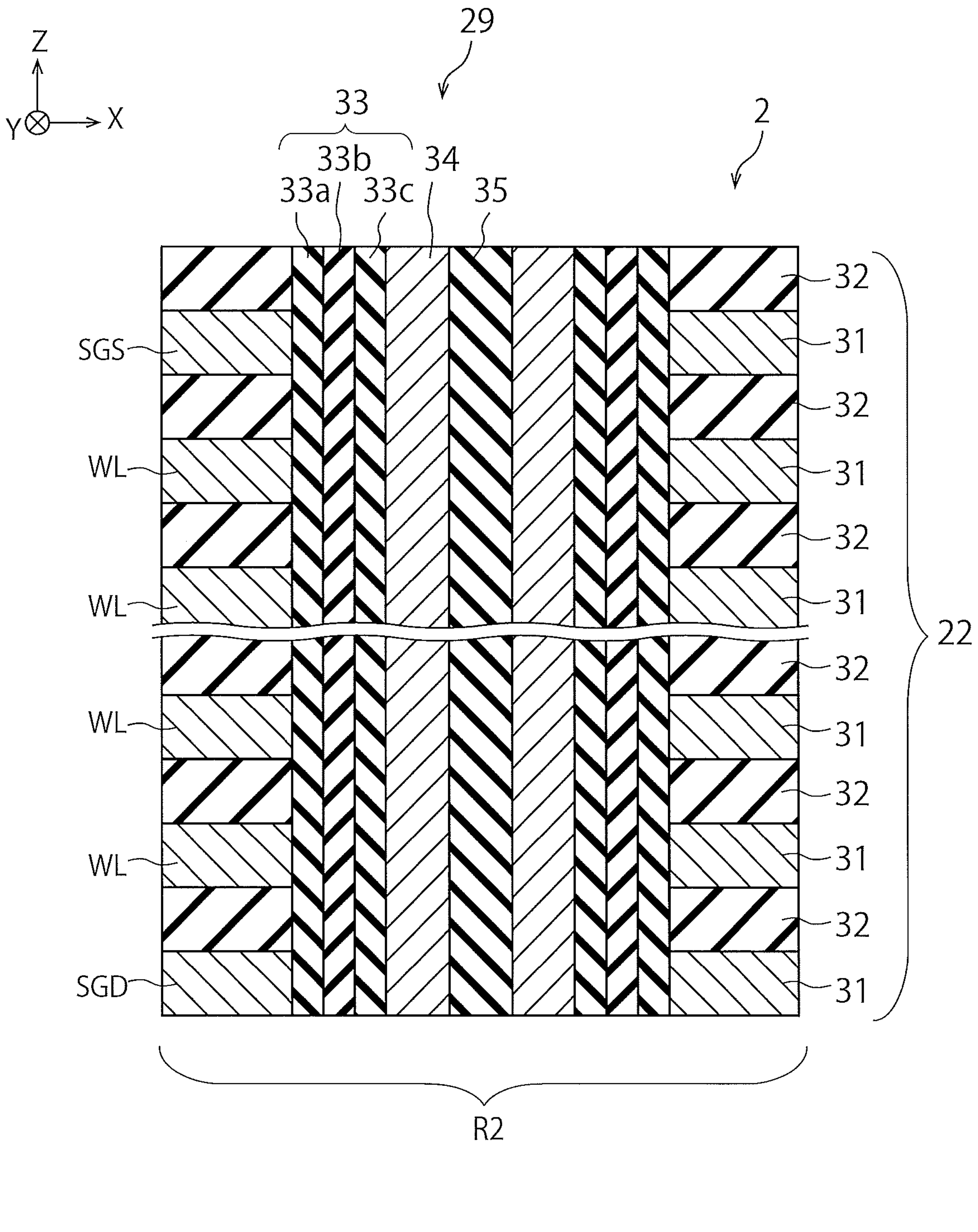
FIG. 2 is a sectional view showing a structure of a columnar portion of the first embodiment.

FIG. 2 is a sectional view showing a structure of the columnar portion 29 of the first embodiment.

FIG. 2 shows one of the plural columnar portions 29 shown in FIG. 1. The columnar portion 29 shown in FIG. 2 includes the memory insulator 33, the channel semiconductor layer 34, the core insulator 35, and the core semiconductor layer 36 (not shown), where the memory insulator 33 includes a block insulator 33*a*, a charge storage layer 33*b*, and a tunnel insulator 33*c*, which are provided in order in the stacked film 22. The block insulator 33*a* is, for example, a $SiO_2$ film. The charge storage layer 33*b* is, for example, a SiN film (silicon nitride film). The tunnel insulator 33*c* is, for example, a $SiO_2$ film.

As with FIG. 1, FIG. 2 further shows plural electrode layers 31 and plural insulators 32 provided in the stacked film 22. In FIG. 2, the stacked film 22 in the region R2 includes plural word lines WL, a source-side selection line SGS, and a drain-side selection line SGD as the electrode layers 31. The word lines WL form plural memory cells, together with the memory insulator 33 and the channel semiconductor layer 34. The source-side selection line SGS is placed above the word lines WL while the drain-side selection line SGD is placed below the word lines WL. In FIG. 2, two or more source-side selection lines SGS may be placed above the word lines WL and two or more drain-side selection lines SGD may be placed below the word lines WL. This is also true for the stacked films 22 in the region R1 and the like.

Figure 3:
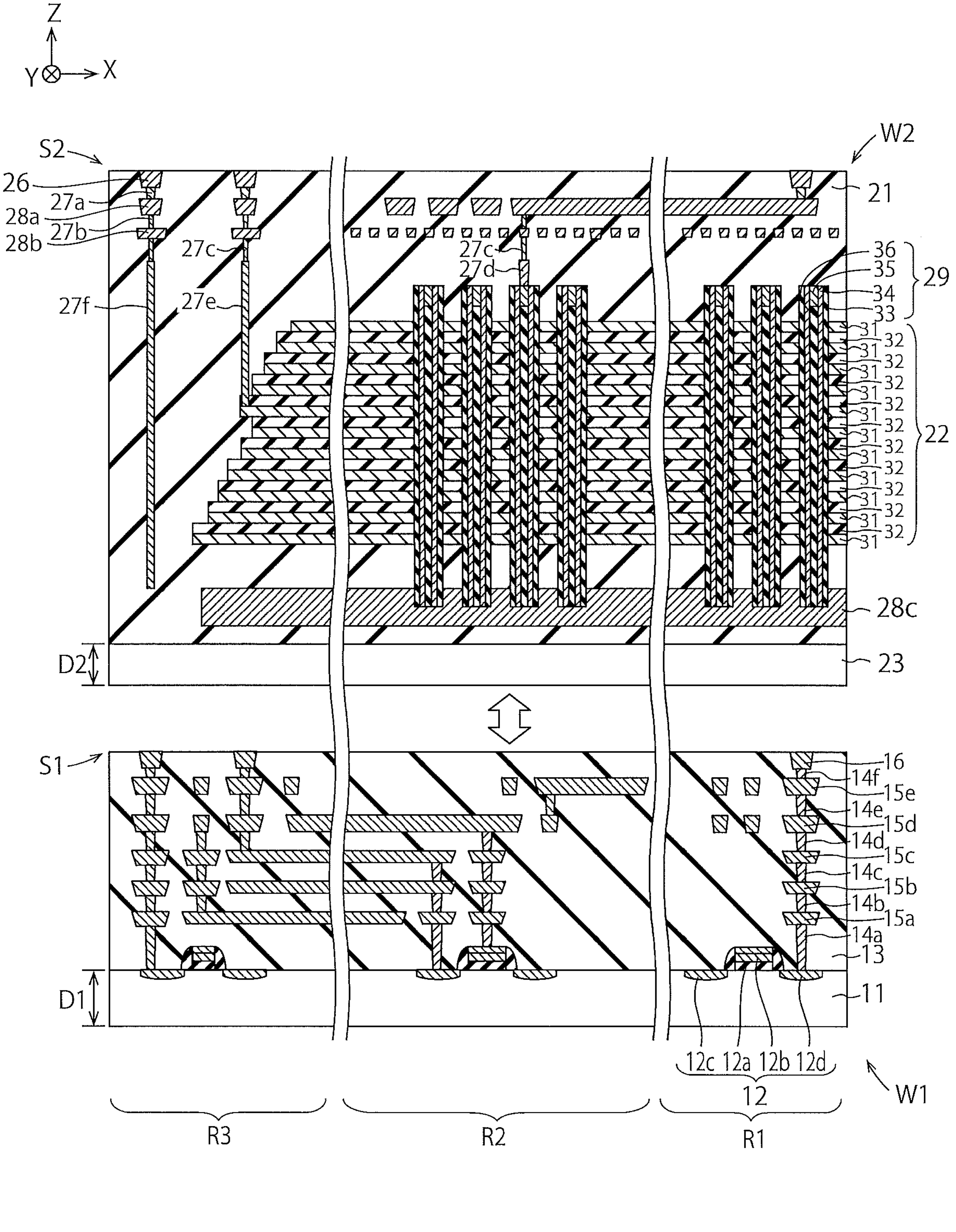
FIGS. 3 and 4 are sectional views showing a method of manufacturing the semiconductor device of the first embodiment.
Figure 4:
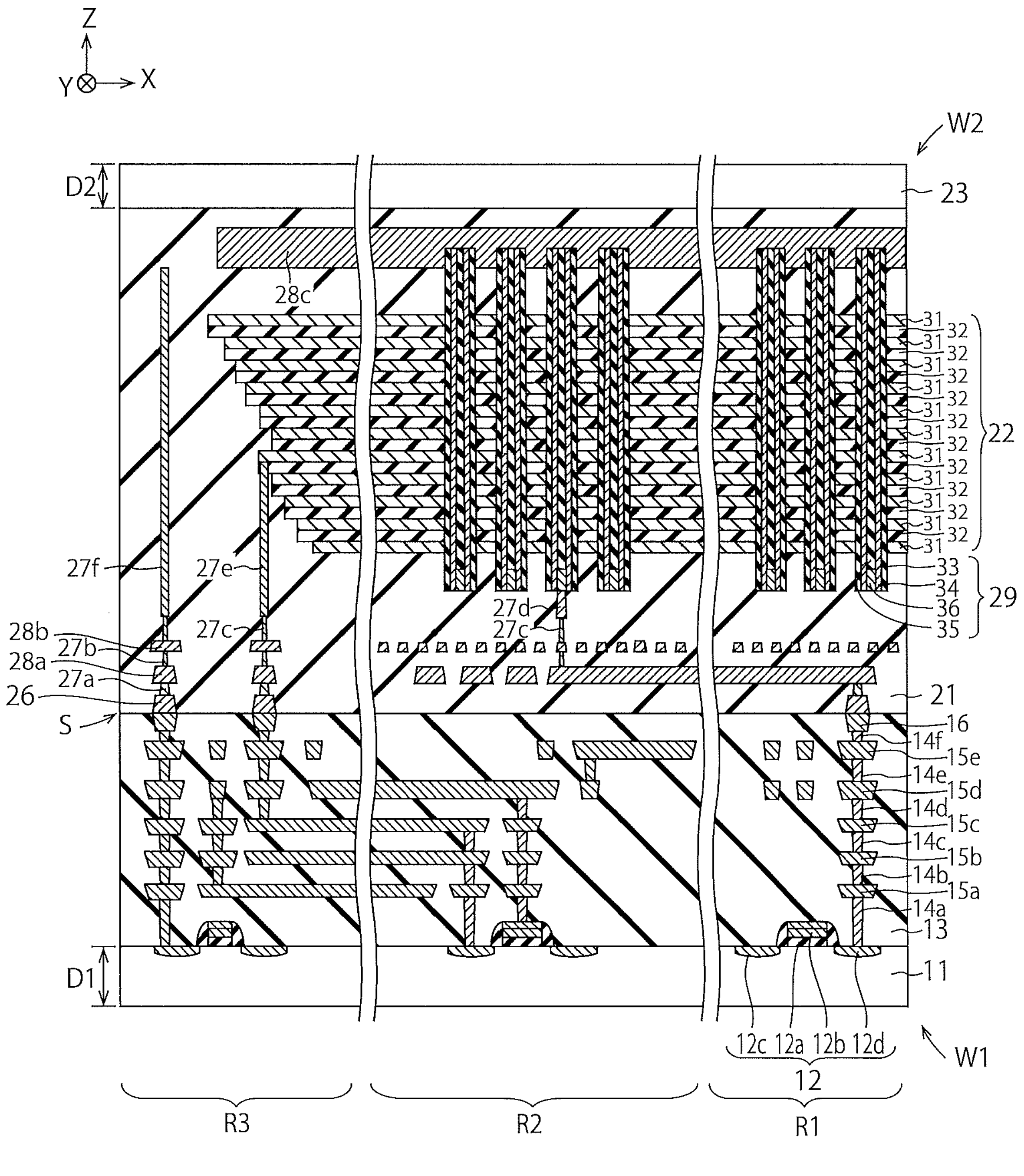

FIGS. 3 and 4 are sectional views showing a method of manufacturing the semiconductor device of the first embodiment.

FIG. 3 shows a circuit wafer W1 including the circuit chip 1 and an array wafer W2 including the array chip 2. FIG. 3 further shows an upper face S1 of the circuit wafer W1 and an upper face S2 of the array wafer W2. The direction of the array wafer W2 shown in FIG. 3 is opposite the direction of the array chip 2 shown in FIG. 1. The semiconductor device of the present embodiment is produced by bonding the circuit wafer W1 and the array wafer W2 as described above. FIG. 3 shows the array wafer W2 before being reversed in direction for bonding and FIG. 4 shows the array wafer W2 after being reversed in direction for bonding and bonded with the circuit wafer W1.

The semiconductor device of the present embodiment is produced, for example, as follows. First, the plural transistors 12, the inter layer dielectric 13, the plural plugs 14*a* to 14*f*, the plural interconnect layers 15*a* to 15*e*, and the plural metal pads 16 are formed on the substrate 11 (FIG. 3). Besides, the inter layer dielectric 21, the stacked film 22, the plural metal pads 26, the plural plugs 27*a* to 27*f*, the plural interconnect layers 28*a* to 28*c*, and the plural columnar portions 29 are formed on the substrate 23 (FIG. 3).

Next, as shown in FIG. 4, the circuit wafer W1 and the array wafer W2 are bonded by mechanical pressure. Consequently, the inter layer dielectric 13 and the inter layer dielectric 21 are bonded together. Next, the circuit wafer W1 and the array wafer W2 are annealed. Consequently, the metal pads 16 and the metal pads 26 are joined together.

Subsequently, the substrates 11 and 23 are reduced in thickness by CMP (Chemical Mechanical Polishing) as required. In so doing, the thickness D2 of the substrate 23 may be made smaller than the thickness D1 of the substrate 11, or larger than the thickness D1 of the substrate 11. Furthermore, the plural transistors 24, the inter layer dielectric 25, the plural plugs 27*g* to 27*j*, and the plural interconnect layers 28*d* and 28*e* are formed on the substrate 23 (see FIG. 1). The plugs 27*i* and 27*j* are formed by penetrating the substrate 23. Then, the circuit wafer W1 and the array wafer W2 are cut into plural semiconductor chips. In this way, the semiconductor chip shown in FIG. 1 is produced.

FIG. 1 shows a boundary face between the inter layer dielectric 13 and the inter layer dielectric 21 as well as a boundary face between the metal pads 16 and the metal pads 26, but it is generally the case that the boundary faces can no longer be observable after the annealing. However, locations where the boundary faces existed can be estimated by detecting inclinations of side faces of the metal pads 16, inclinations of side faces of the metal pads 26, and displacement between the side faces of the metal pads 16 and the metal pads 26.

Figure 5:
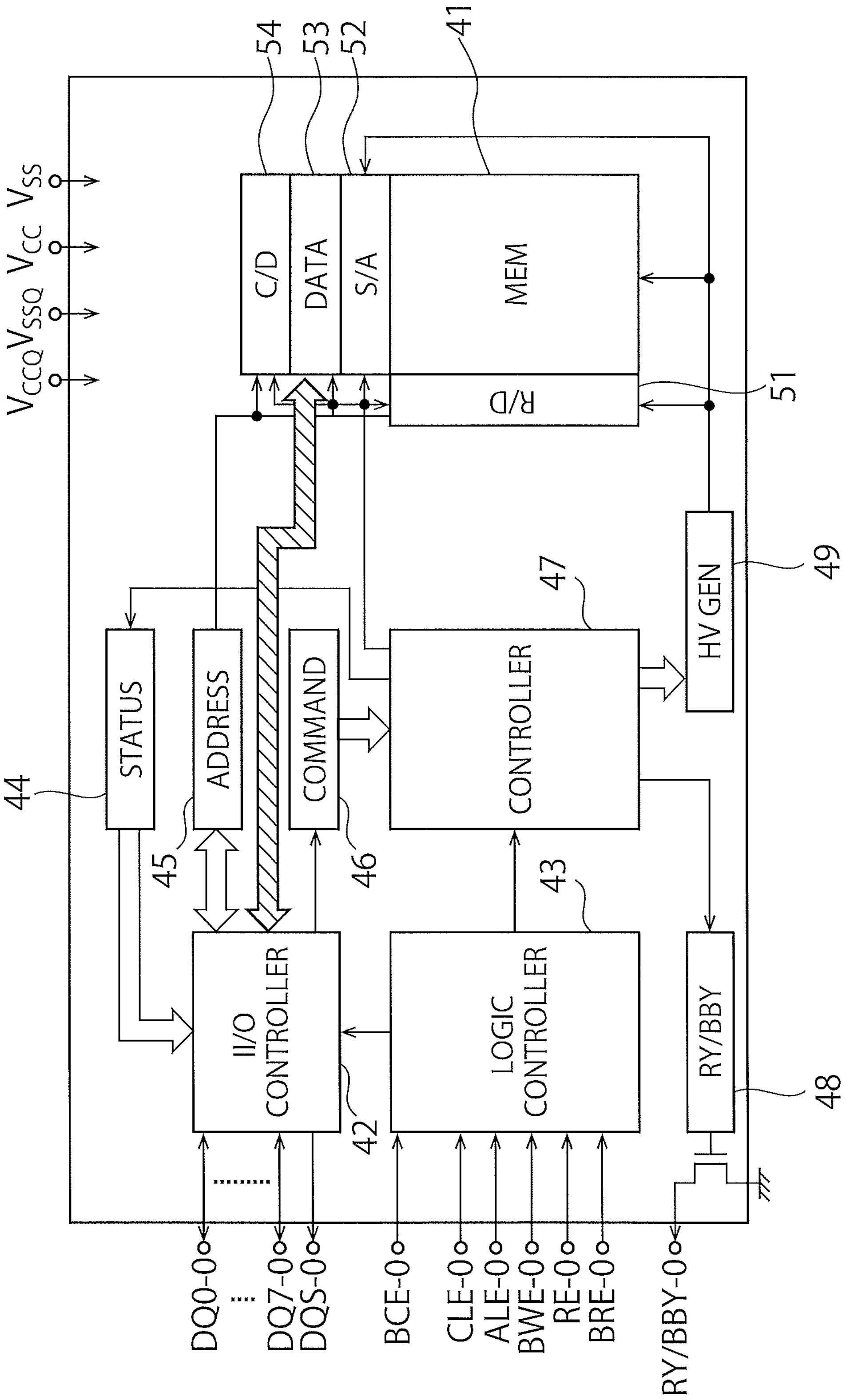
FIG. 5 is a block diagram showing a configuration of the semiconductor device of the first embodiment.

FIG. 5 is a block diagram showing a configuration of the semiconductor device of the first embodiment.

In FIG. 5, the semiconductor device of the present embodiment includes a memory cell array 41, an I/O (Input/Output) controller 42, a logic controller 43, a status register 44, an address register 45, a command register 46, a controller 47, a ready/busy circuit 48, a voltage generator 49, a row decoder 51, a sense amplifier 52, a data register 53, and a column decoder 54.

The memory cell array 41 is formed of the stacked film 22 and the columnar portions 29 described above and includes plural memory cells. The I/O controller 42 exchanges input signals and output signals with a controller (not shown) via data lines DQ0-0 to DQ7-0. The logic controller 43 receives a chip enable signal BCE-0, a command latch enable signal CLE-0, an address latch enable signal ALE-0, a write enable signal BWE-0, and read enable signals RE-0 and BRE-0, and controls operations of the I/O controller 42 and the controller 47 of these signals.

The status register 44 is used to store status of read operations, write operations, erase operations and the like, and notify the controller about completion of these operations. The address register 45 is used to store address signals received by the I/O controller 42 from the controller. The command register 46 is used to store the command signals received by the I/O controller 42 from the controller.

The controller 47 performs read operations, write operations, erase operations, and the like by controlling the status register 44, the ready/busy circuit 48, the voltage generator 49, the row decoder 51, the sense amplifier 52, the data register 53, and the column decoder 54 of command signals from the command register 46.

The ready/busy circuit 48 transmits a ready/busy signal RY/BBY-0 to the controller of operating conditions of the controller 47. This makes it possible to indicate whether or not the controller 47 is ready to receive a command. The voltage generator 49 generates voltages needed for read operations, write operations, and erase operations.

The row decoder 51 applies voltages to the word lines WL of the memory cell array 41. The sense amplifier 52 detects data read out to the bit lines BL of the memory cell array 41. The data register 53 is used to store data from the I/O controller 42 and the sense amplifier 52. The column decoder 54 decodes a column address, and selects a latch circuit in the data register 53 based on a decoding result. The row decoder 51, the sense amplifier 52, the data register 53, and the column decoder 54 function as interfaces for read operations, write operations, and erase operations with respect to the memory cell array 41.

Except for the memory cell array 41, these blocks are included in the CMOS circuit described above and are formed of the transistors 12 and 24. For example, the sense amplifier 52, the data register 53, and the column decoder 54 are formed of the transistors 12 on the substrate 11, and the other blocks are formed of the transistors 24 on the substrate 23.

According to the present embodiment, the voltage generator 49 and the row decoder 51 are formed of HV transistors and the other blocks are formed of LV transistors. Therefore, the voltage generator 49 and the row decoder 51 may be placed on the substrate 23, with the other blocks placed on the substrate 11. This makes it possible to place only LV transistors on the substrate 11 while placing only HV transistors on the substrate 23.

The sense amplifier 52 includes, for example, transistors that function as switches for bit lines BL. The transistors are, for example, HV transistors. In this case, by placing part of the sense amplifier 52 on the substrate 11 and placing the rest of the sense amplifier 52 on the substrate 23, the HV transistors may be placed on the substrate 23, as the transistors 24.

The voltage generator 49 includes, for example, capacitors. Therefore, the voltage generator 49 often has a large area. In this case, in designing the semiconductor device, if it is determined to move some of the blocks on the substrate 11 onto the substrate 23, desirably the voltage generator 49 with a large area is moved onto the substrate 23.

FIGS. 6A to 9B are sectional views showing details of the method of manufacturing the semiconductor device of the first embodiment. Specifically, FIGS. 6A to 9B show details of steps related to the array wafer W2.

Figure 6A:
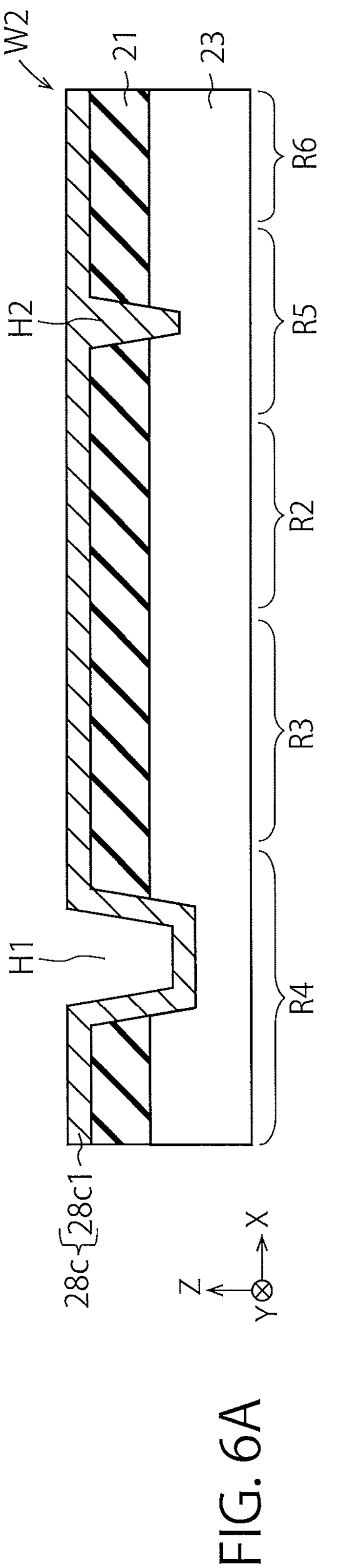
FIGS. 6A to 9B are sectional views showing details of the method of manufacturing the semiconductor device of the first embodiment.

FIG. 6A shows the array wafer W2 before bonding. First, the inter layer dielectric 21 (part of the inter layer dielectric 21, to be exact) is formed on the substrate 23, openings H1 and H2 are formed in the inter layer dielectric 21 and the substrate 23, and interconnect material 28*c*1 for the interconnect layer 28*c* is formed on the inter layer dielectric 21 and the substrate 23 (FIG. 6A). As a result, the interconnect material 28*c*1 is formed in the openings H1 and H2. The opening H1 is not fully buried by the interconnect material 28*c*1, but the opening H2 is fully buried by the interconnect material 28*c*1. In FIG. 6A, a region R4 is an alignment mark region including the opening H1, a region R5 is an ACP region including the opening H2, and a region R6 is an edge seal region.

Figure 6B:
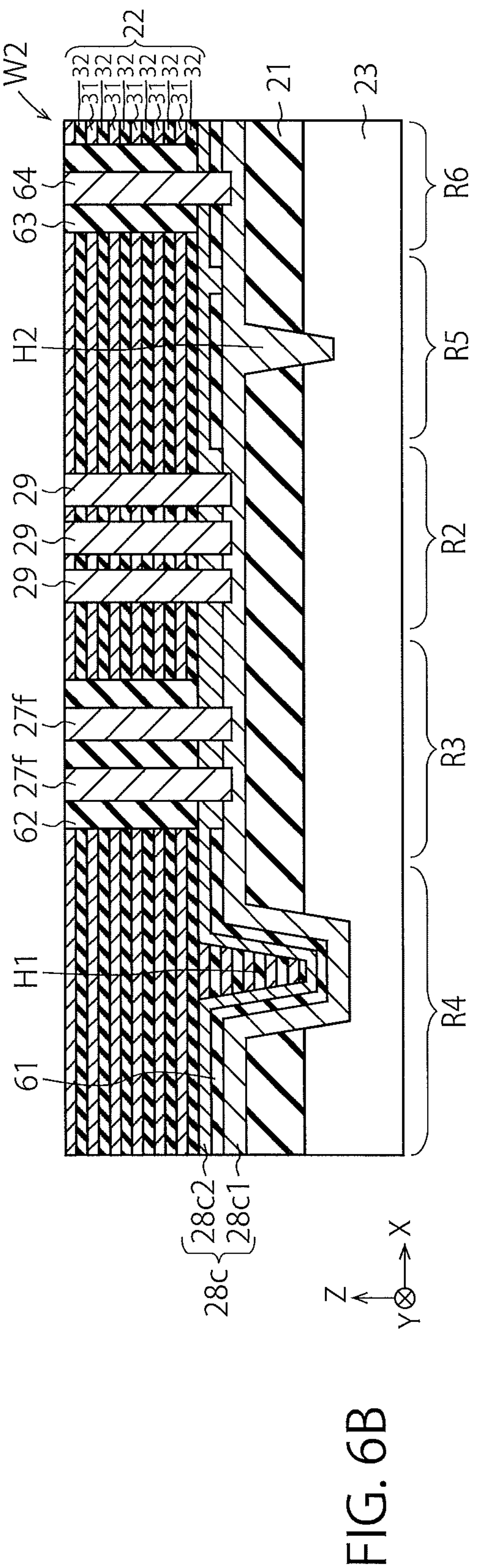

Next, an insulator 61 is formed on the interconnect material 28*c*1, part of the insulator 61 is removed by etching, and interconnect material 28*c*2 for the interconnect layer 28*c* is formed on the interconnect material 28*c*1 and the insulator 61 (FIG. 6B). As a result, the interconnect layer 28*c* including the interconnect materials 28*c*1 and 28*c*2 electrically connected with each other is formed on the inter layer dielectric 21. The opening H1 is not fully buried by the interconnect materials 28*c*1 and 28*c*2.

Next, the stacked film 22 is formed on the interconnect material 28*c*2 and plural plugs 27*f* and plural columnar portions 29 are formed in the stacked film 22 (FIG. 6B). The plugs 27*f* are formed in the stacked film 22 via an insulator 62. Also, an interconnect layer 64 is formed in the stacked film 22 via an insulator 63 (FIG. 6B). The plugs 27*f*, the columnar portions 29, and the interconnect layer 64 are formed reaching the interconnect layer 28*c*. The plugs 27*f* shown in FIG. 6B are formed in the stacked film 22 unlike the plug 27*f* shown in FIG. 1. Alternatively, the stacked film 22 may be formed by stacking plural sacrificial layers and plural insulators 32 alternately and replacing the sacrificial layers with plural electrode layers 31. Part of the stacked film 22 is buried in the opening H1.

Figure 7A:
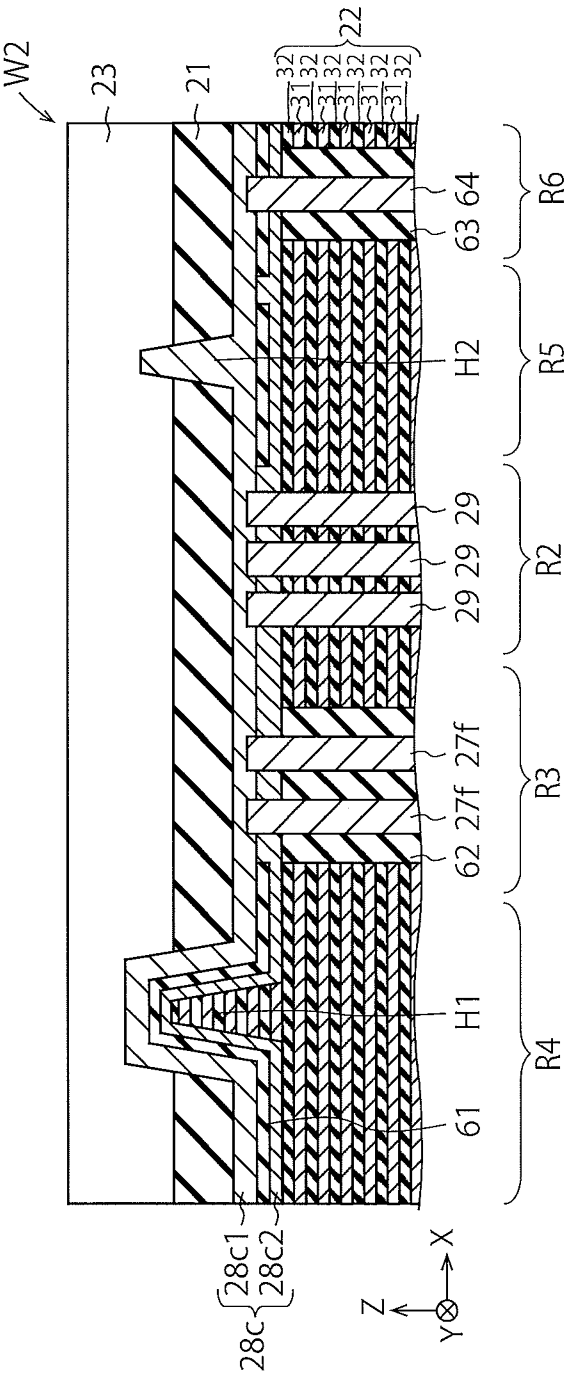
Figure 7B:
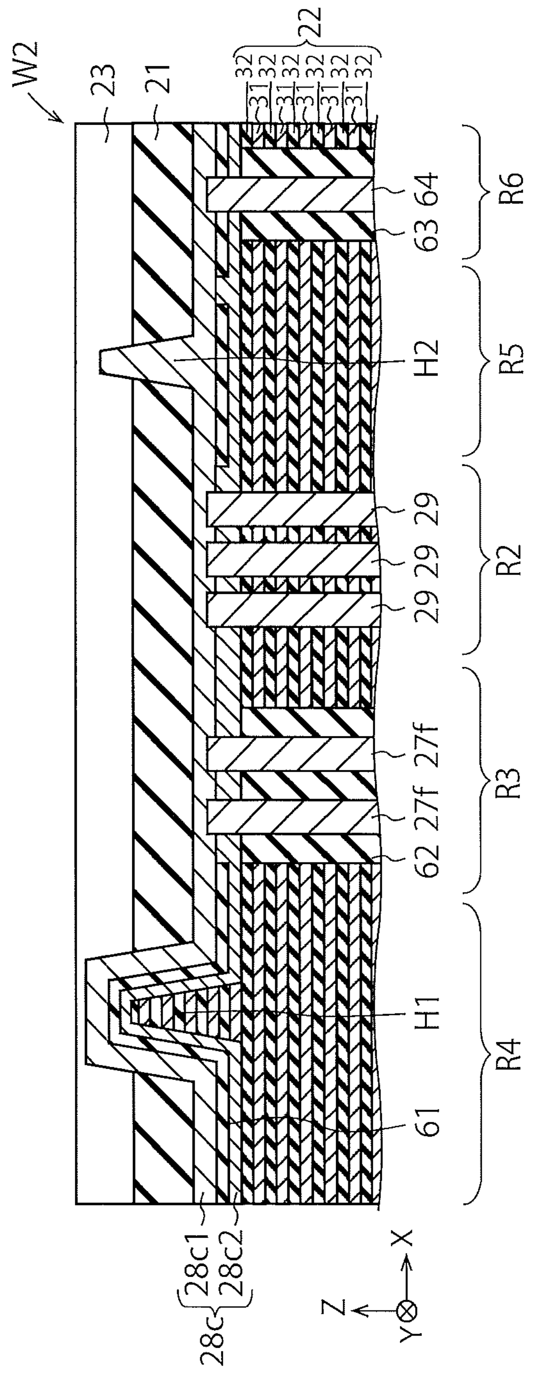

Next, the array wafer W2 is bonded with a non-illustrated circuit wafer W1 (FIG. 7A). As a result, the direction of the array wafer W2 shown in FIG. 7A is opposite the direction of the array chip 2 shown in FIG. 6B. Next, the substrate 23 is reduced in thickness by CMP (FIG. 7B). The reduction in thickness is carried out in such a way that the layers in the openings H1 and H2 will not be exposed to the upper face of the substrate 23.

Figure 8A:
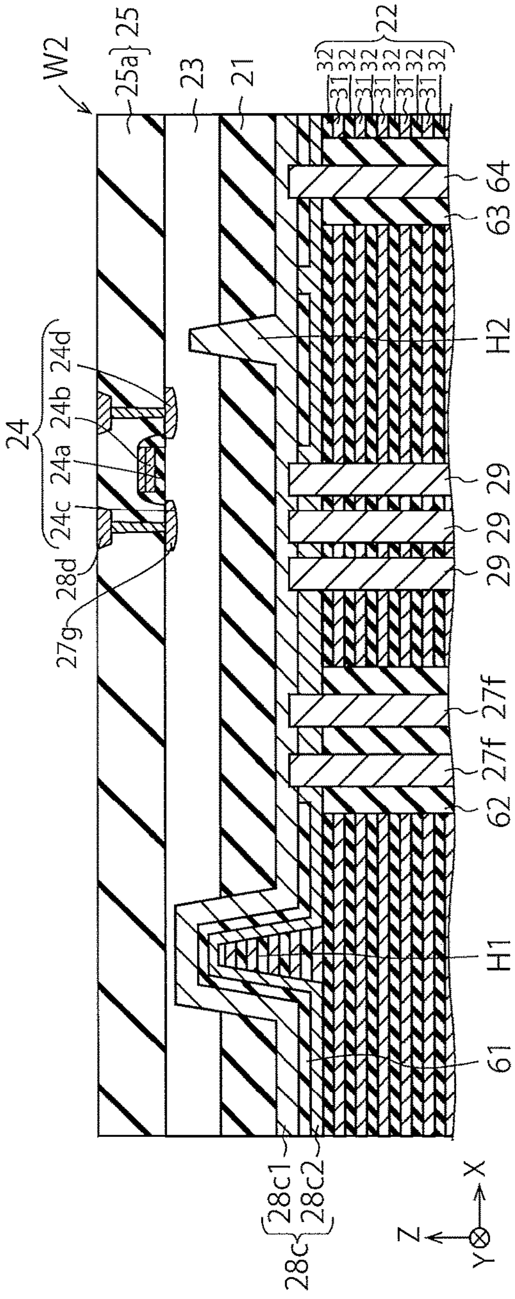
Figure 8B:
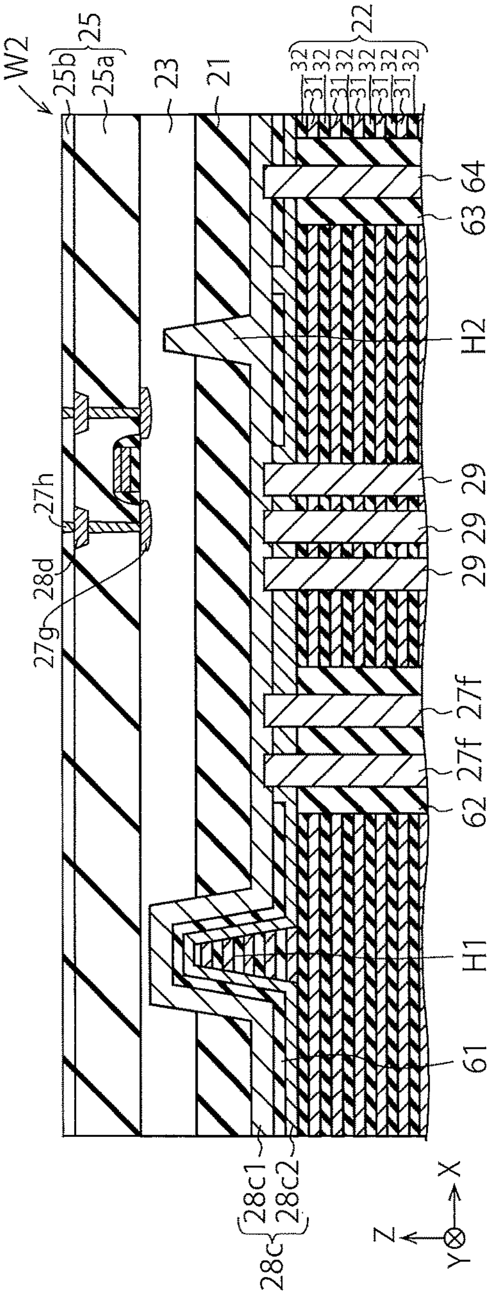

Next, the transistor 24, an insulator 25*a* for the inter layer dielectric the plug 27*g*, and the interconnect layer 28*d* are formed on the substrate 23 (FIG. 8A). Next, an insulator 25*b* for the inter layer dielectric and the plug 27*h* are formed on the insulator 25*a* and the interconnect layer 28*d* (FIG. 8B).

Figure 9A:
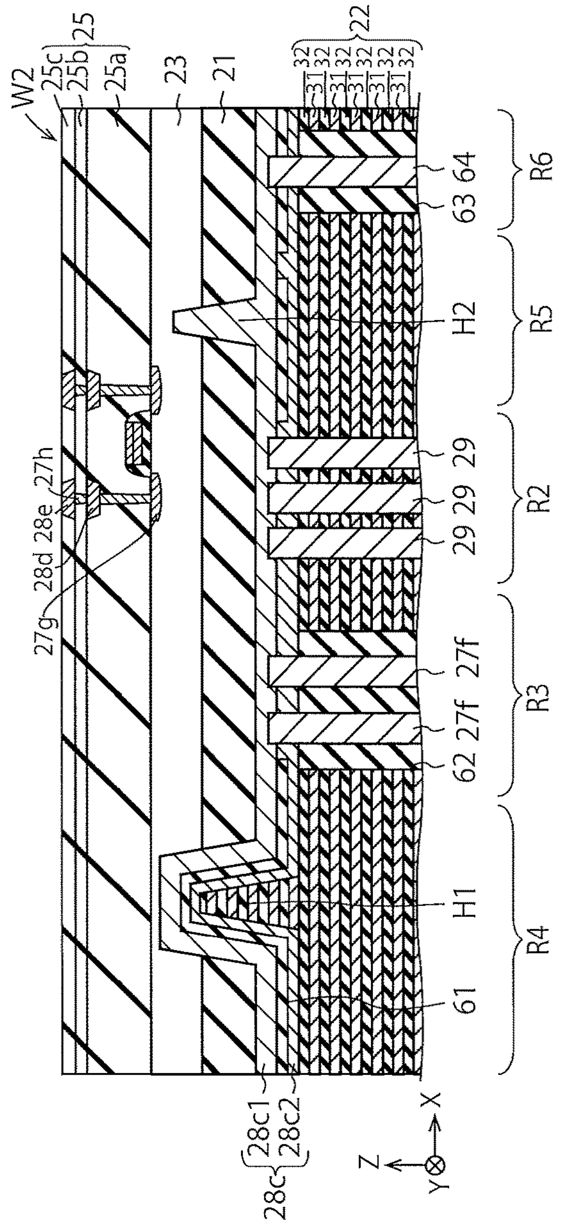

Next, the interconnect layer 28*e* and an insulator 25*c* for the inter layer dielectric 25 are formed on the insulator 25*b* and the plug 27*h* (FIG. 9A). The interconnect layer 28*e* shown in FIG. 9A is formed in the inter layer dielectric 25 unlike the interconnect layer 28*e* shown in FIG. 1.

Figure 9B:
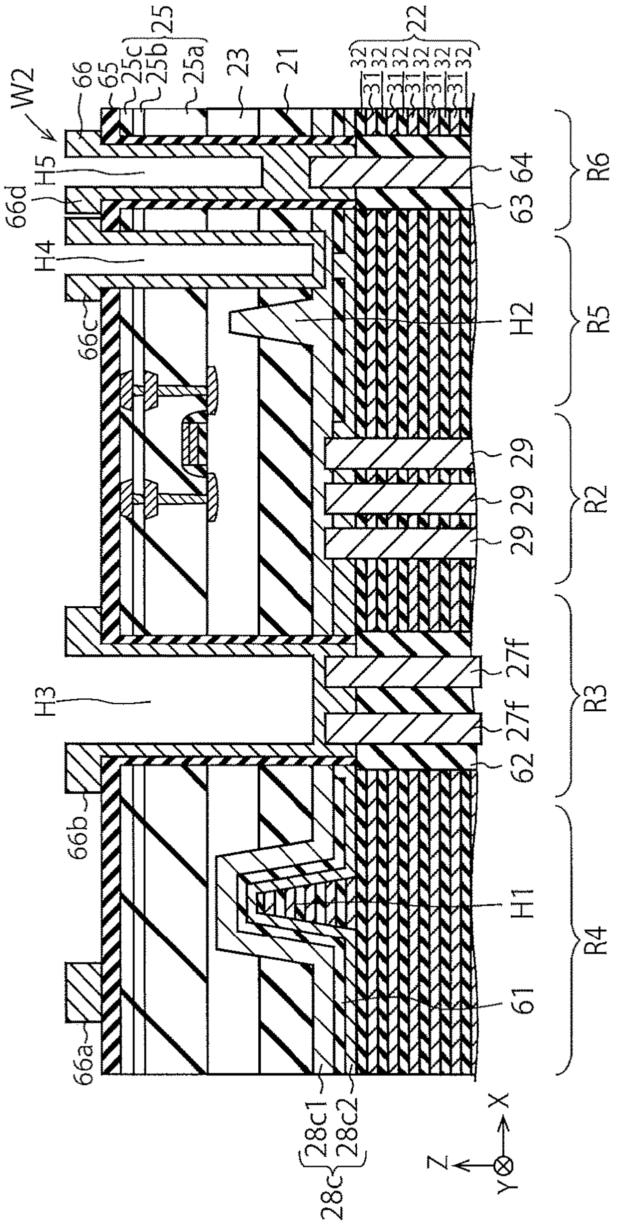

Next, openings H3, H4, and H5 are formed by etching in the inter layer dielectric 25, the substrate 23, the inter layer dielectric 21, the interconnect layer 28*c*, and the like (FIG. 9B). The openings H3, H4, and H5 are formed in the regions R3, R5, and R6, respectively.

Next, an insulator 65 is formed on the inter layer dielectric 25 and part of the insulator 65 and the like are removed by etching (FIG. 9B). As a result, the plugs 27*f* are exposed to a bottom of the opening H3, the interconnect layer 28*c* is exposed to a bottom of the opening H4, and the interconnect layer 64 is exposed to a bottom of the opening H5.

Next, an interconnect layer 66 is formed on the insulator 65 and part of the interconnect layer 66 and the like are removed by etching (FIG. 9B). As a result, interconnects 66*a* to 66*d* are formed from the interconnect layer 66. The interconnect 66*a* is formed on the insulator 65 in the region R4. The interconnect 66*b* is formed on a side face and bottom face of the opening H3 in the region R3 and placed on the plugs 27*f*. The interconnect 66*c* is formed on a side face and bottom face of the opening H4 in the region R5 and placed on the interconnect layer 28*c*. The interconnect 66*d* is formed on a side face and bottom face of the opening H5 in the region R6 and placed on the interconnect layer 64. The interconnect layer 66 is, for example, a metal layer including an Al (aluminum) layer. In FIG. 9B, at least some of interconnects in the interconnect layer 66 function as bonding pads unlike FIG. 1.

In this way, the semiconductor device of the present embodiment is produced. The steps omitted in the description of FIG. 6A to FIG. 9B can be carried out in a manner similar to the steps described with reference to FIGS. 3 and 4.

Figure 10A:
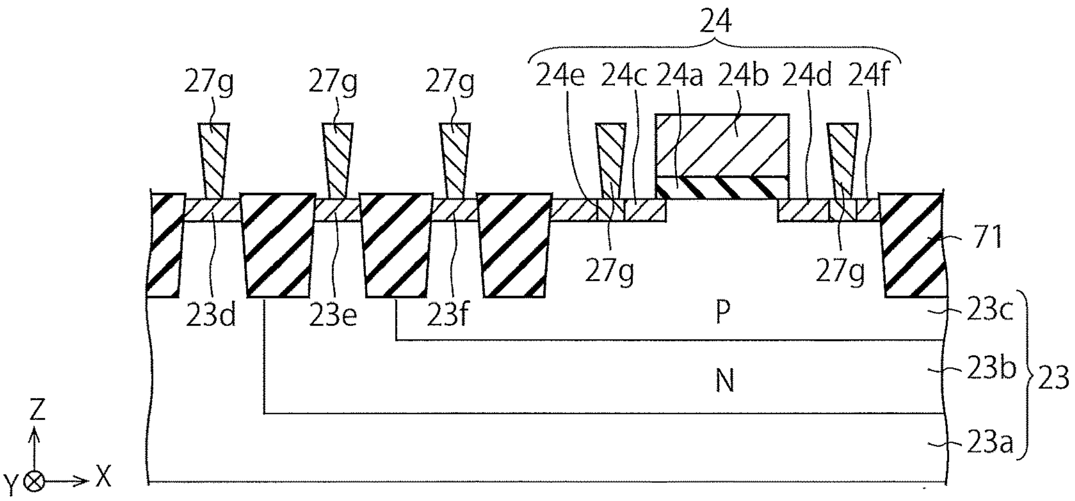
FIGS. 10A to 10C are sectional views showing examples of the structure of the semiconductor device of the first embodiment.
Figure 10B:
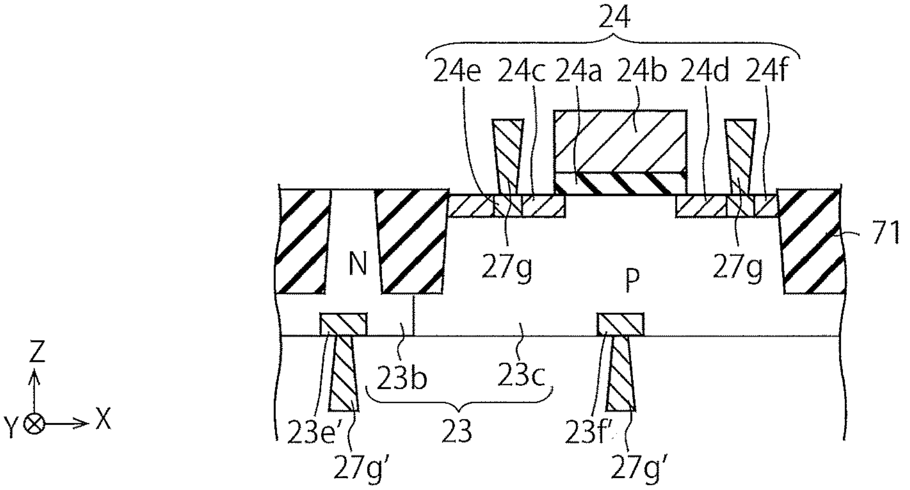
Figure 10C:
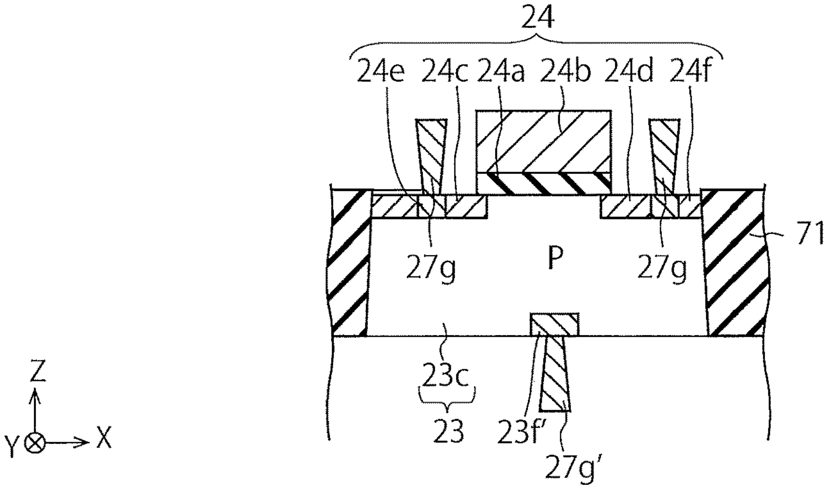

FIGS. 10A to 10C are sectional views showing examples of the structure of the semiconductor device of the first embodiment.

In the example shown in FIG. 10A, the substrate 23 includes a semiconductor layer 23*a*, wells 23*b* and 23*c*, and diffusion layers 23*d* to 23*f*, and the transistor 24 further includes diffusion layers 24*e* and 24*f*. FIG. 10A further shows isolation insulators 71.

The well 23*b* is an n-well provided on a top side of the semiconductor layer 23*a*. The well 23*c* is a p-well provided on a top side of the well 23*b*. The substrate 23 shown in FIG. 10A has a triple-well structure that includes the semiconductor layer 23*a*, the well 23*b*, and the well 23*c*.

The diffusion layers 23*d*, 23*e*, and 23*f* are formed in the semiconductor layer 23*a*, the well 23*b*, and the well 23*c*, respectively, near the upper face of the substrate 23 and placed in contact with the plugs 27*g*. The plugs 27*g* on the diffusion layers 23*d*, 23*e*, and 23*f* are used to keep potentials of the semiconductor layer 23*a*, the well 23*b*, and the well 23*c*, respectively, at predetermined values. The predetermined potential values of the semiconductor layer 23*a*, the well 23*b*, and the well 23*c* are, for example, 0 V, 0 to 2 V, and −2 V, respectively. The diffusion layers 23*d*, 23*e*, and 23*f* are sandwiched between respective pairs of isolation insulators 71. Similarly, the diffusion layers 24*c* to 24*f* of the transistor 24 are sandwiched between respective pairs of isolation insulators 71. In the example shown in FIG. 10A, the diffusion layers 23*d*, 23*e*, and 23*f* are a p+ layer, an n+ layer, and a p+ layer, respectively.

The diffusion layer 24*e* is provided in the diffusion layer 24*c* and placed in contact with the plug 27*g*. The diffusion layer 24*f* is provided in the diffusion layer 24*d* and placed in contact with the plug 27*g*. In the example shown in FIG. 10A, the diffusion layers 24*c* and 24*d* are n-layers while the diffusion layers 24*e* and 24*f* are n+ layers. The transistor 24 shown in FIG. 10A is formed on the well 23*c*.

FIG. 1013 shows a structure similar to the structure shown in FIG. 10A. However, in the example shown in FIG. 1013, the substrate 23 includes wells 23*b* and 23*c* and diffusion layers 23*e*' and 23*f*', and some of the plugs 27*g* are replaced with plugs 27*g*'. In this case the well 23*c* is an example of a first well and the plugs 27*g*' are an example of a first plug.

In the example shown in FIG. 10B, the well 23*b* is an n-well extending from the upper face to a lower face of the substrate 23 and the well 23*c* is a p-well extending from the upper face to the lower face of the substrate 23. The diffusion layers 23*e*' and 23*f*' are formed in the wells 23*b* and 23*c*, respectively, near the lower face of the substrate 23 and placed in contact with the plugs 27*g*'. Therefore, the plugs 27*g*' are placed in contact with the lower face of the substrate 23 and located under the wells 23*b* and 23*c*, respectively. The plugs 27*g*' under the diffusion layers 23*e*' and 23*f*' are used to keep potentials of the respective wells 23*b* and 23*c* at the predetermined values. In the example shown in FIG. 10B, the diffusion layers 23*e*' and 23*f*' are an n+ layer and a p+ layer, respectively.

According to the present example, by replacing some of the plugs 27*g* with plugs 27*g*', it becomes possible to reduce the area needed in order to place the plugs 27*g* (and the plugs 27*g*'). Also, the present example makes it possible to eliminate the need for the semiconductor layer 23*a*.

FIG. 10C shows a structure similar to the structure shown in FIG. 10B. However, in the example shown in FIG. 10C, the substrate 23 includes a well 23*c* and a diffusion layer 23*f*', and the isolation insulators 71 penetrate the substrate 23. In this case, the well 23*c* is an example of a first well and the plug 27*g*' is an example of a first plug.

In the example shown in FIG. 10C, the well 23*c* is a p-well extending from the upper face to the lower face of the substrate 23 by being sandwiched between the isolation insulators 71 that penetrate the substrate 23. The diffusion layer 23*f* is formed in the well 23*c* near the lower face of the substrate 23 and placed in contact with the plug 27*g*'. Therefore, the plug 27*g*' is placed in contact with the lower face of the substrate 23 and located under the well 23*c*. The plug 27*g*' under the diffusion layer 23*f* is used to keep the potential of the well 23*c* at the predetermined value. In the example shown in FIG. 10C, the diffusion layer 23*f* is a p+ layer.

According to the present example, as with the example shown in FIG. 10B, by replacing some of the plugs 27*g* with plugs 27*g*', it becomes possible to reduce the area needed in order to place the plugs 27*g* (and the plugs 27*g*'). Also, the present example makes it possible to eliminate the need for the semiconductor layer 23*a* and the well 23*b*.

As described above, the semiconductor device of the present embodiment includes the transistors 12 on the substrate 11 for the circuit chip 1 and the transistors 24 on the substrate 23 for the array chip 2. Therefore, the present embodiment makes it possible to suitably reduce the area of the semiconductor device (semiconductor chip).

Second Embodiment

Figure 11:
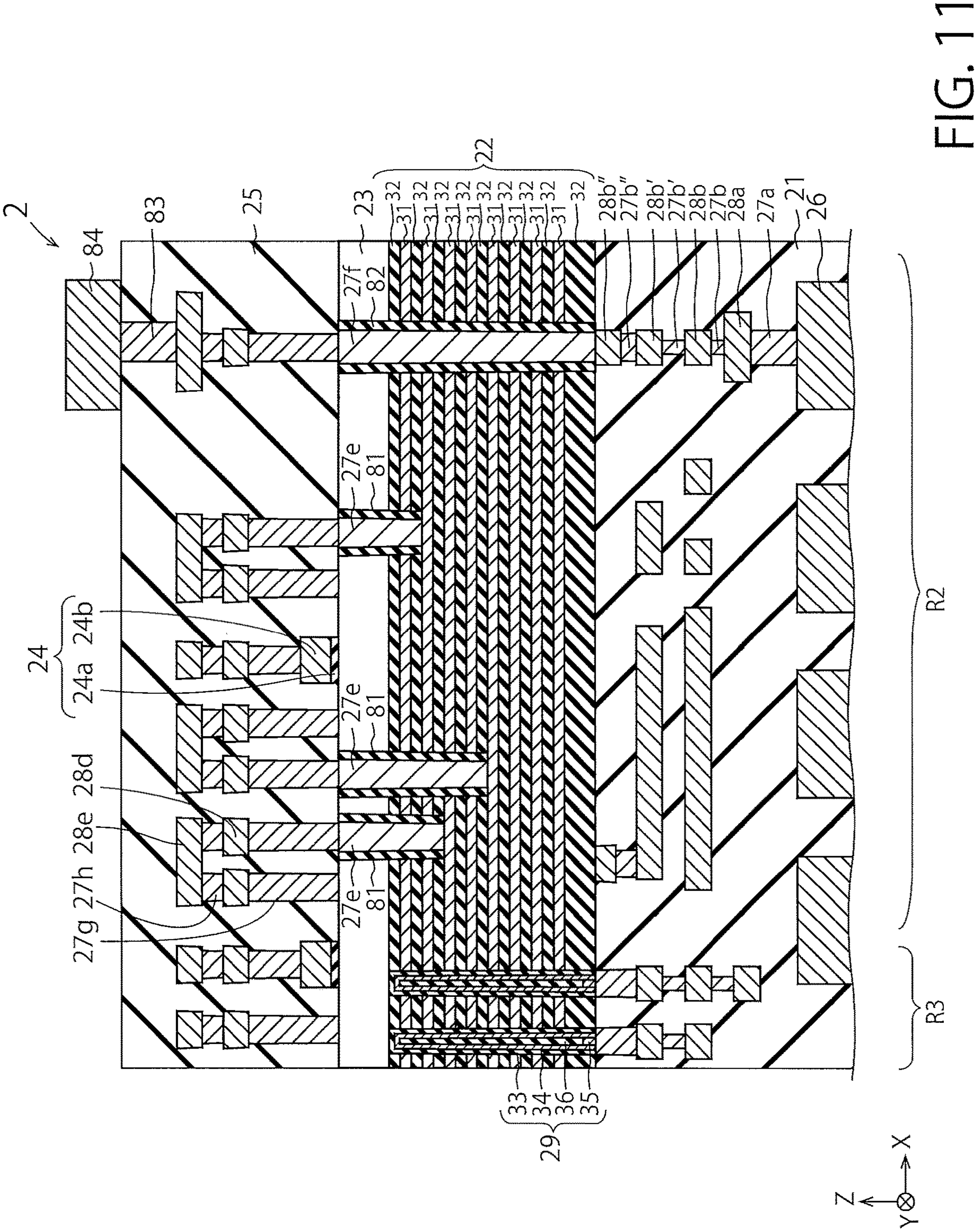
FIG. 11 is a sectional view showing a structure of a semiconductor device of a second embodiment.

FIG. 11 is a sectional view showing a structure of a semiconductor device of a second embodiment.

The semiconductor device of the present embodiment (FIG. 11) has a structure similar to the structure of the semiconductor device of the first embodiment (FIG. 1). However, as described below, the structure of the semiconductor device of the present embodiment differs from the structure of the semiconductor device of the first embodiment in some ways. Whereas FIG. 11 illustrates the array chip 2, illustration of the circuit chip 1 is omitted.

The arrangement of plugs 27*e* and 27*f* shown in FIG. 11 differs from the arrangement of plugs 27*e* and 27*f* shown in FIG. 1. The plugs 27*e* shown in FIG. 11 are electrically connected to the electrode layers 31 as with the plugs 27*e* shown in FIG. 1, but placed on an upper side rather than underside of the stacked film 22. As with the plug 27*f* shown in FIG. 1, the plug 27*f* shown in FIG. 11 is longer in the Z direction than the Z-direction thickness of the stacked film 22, but placed inside the stacked film 22 rather than outside the stacked film 22. The plugs 27*e* and 27*f* shown in FIG. 11 are examples of a second plug. The semiconductor device of the present embodiment further includes plural plugs 27*b*', an interconnect layer 28*b*', plural plugs 27*b*", and an interconnect layer 28*b*".

Details of the plugs 27*e* shown in FIG. 11 will be described below.

FIG. 11 illustrates by example three plugs 27*e*. Each of the plugs 27*e* is formed in the stacked film 22 and the substrate 23 via an insulator 81 and electrically connected to one electrode layer 31 and one plug 27*g*. Specifically, the left plug 27*e* penetrates the first and second electrode layers 31 from the top (a second electrode layer) and electrically connected to the third electrode layer 31 from the top (a first electrode layer). The right plug 27*e* penetrates the first electrode layer 31 from the top (the second electrode layer) and electrically connected to the second electrode layer 31 from the top (the first electrode layer). The center plug 27*e* penetrates the first to fourth electrode layers 31 from the top (the second electrode layer) and electrically connected to the fifth electrode layer 31 from the top (the first electrode layer). According to the present embodiment, by placing the plugs 27*e* on the top side of the stacked film 22, it becomes easy to electrically connect the electrode layers 31 (e.g., word lines) and the transistors 24 (e.g., word line switches) with each other. The word line switches are, for example, HV transistors provided in the row decoder 51 (FIG. 5).

Next, details of the plug 27*f* shown in FIG. 11 will be described.

The plug 27*f* is formed in the stacked film 22 and the substrate 23 via an insulator 82 and electrically connects one plug 27*b*" and one plug 27*g*. Specifically, the plug 27*f* is electrically connected to the metal pad 26 via the plug 27*a*, the interconnect layer 28*a*, the plug 27*b*, the interconnect layer 28*b*, the plug 27*b*', the interconnect layer 28*b*', the plug 27*b*", and the interconnect layer 28*b*". The metal pad 26 is electrically connected, for example, to a non-illustrated transistor 12. The plug 27*f* is electrically connected to a bonding pad 84 via the plug 27*g*, the interconnect layer 28*d*, the plug 27*h*, the interconnect layer 28*e*, and a plug 83. The bonding pad 84 is formed on the inter layer dielectric 25.

Figure 12:
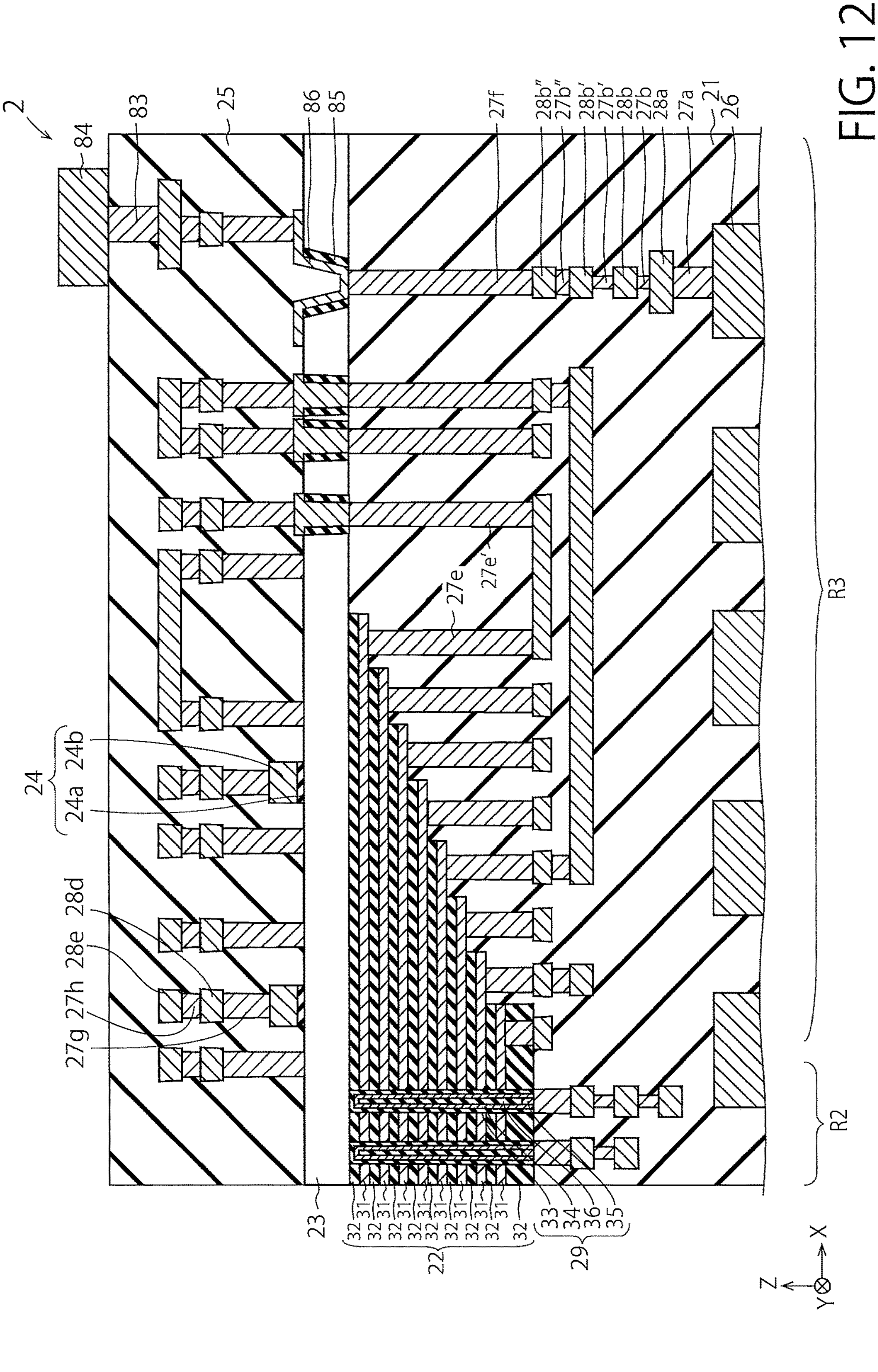
FIG. 12 is a sectional view showing a structure of a semiconductor device of a comparative example of the second embodiment.

FIG. 12 is a sectional view showing a structure of a semiconductor device of a comparative example of the second embodiment.

The semiconductor device (FIG. 12) of the present comparative example has a structure similar to the structure of the semiconductor device of the second embodiment (FIG. 11). However, the arrangement of plugs 27*e* and 27*f* of the present comparative example differs from the arrangement of plugs 27*e* and 27*f* of the second embodiment.

The plugs 27*e* of the present comparative example are placed on the underside of the stacked film 22 having a staircase structure.

Therefore, each of the plugs 27*e* of the present comparative example is electrically connected to the plug 27*g* via the interconnect layer 28*b*", a plug 27*e*', and an interconnect layer 86. In FIG. 12, each interconnect in the interconnect layer 86 is formed in the substrate 23 via an insulator 85. Each of the plugs 27*e* of the present comparative example is electrically connected to the plug 27*g* via a complex interconnect structure. On the other hand, the present embodiment makes it possible to electrically connect each plug 27*e* to the plug 27*g* using a simple interconnect structure.

The plug 27*f* of the present comparative example is placed outside the stacked film 22 having a staircase structure. As with the plugs 27*e* of the present comparative example, the plug 27*f* of the present comparative example is electrically connected to the plug 27*g* via the interconnect layer 86. On the other hand, the present embodiment makes it possible to electrically connect the plug 27*f* to the plug 27*g* directly.

Figure 13A:
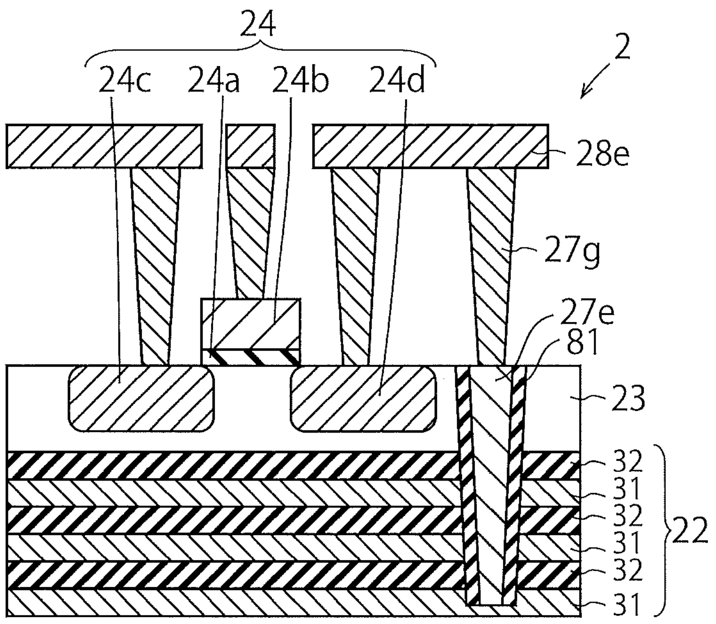
FIGS. 13A and 13B are sectional views showing an example of the structure of the semiconductor device of the second embodiment.
Figure 13B:
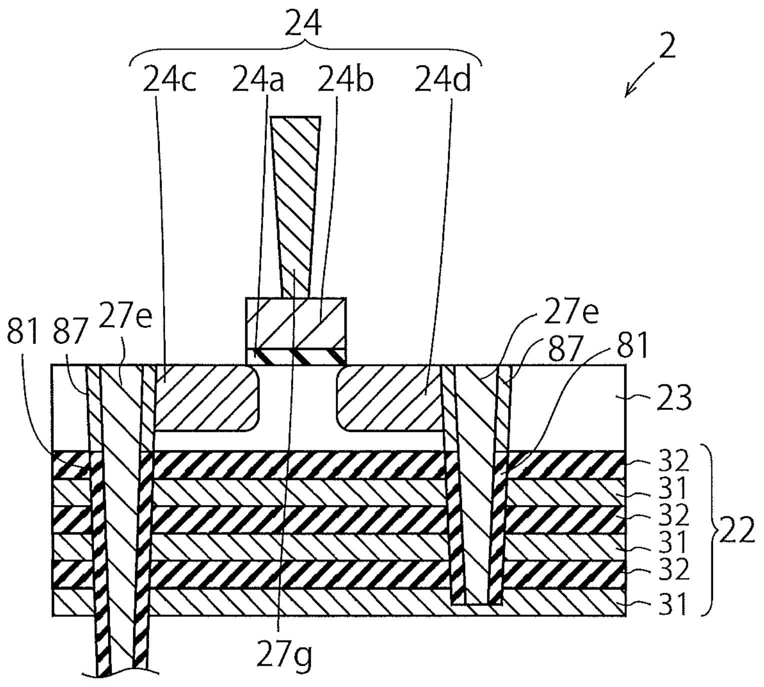

FIGS. 13A and 13B are sectional views showing an example of the structure of the semiconductor device of the second embodiment.

FIG. 13A is an enlarged sectional view showing the transistor 24 and plug 27*e* of FIG. 11. In the example shown in FIG. 13A, the plug 27*e* is electrically connected to the diffusion layer 24*d* of the transistor 24 via the right plug 27*g*, the interconnect layer 28*e*, and the center plug 27*e*.

FIG. 13B shows the transistor 24 and two plugs 27*e*. In the example shown in FIG. 13B, the left plug 27*e* is electrically connected to the diffusion layer 24*c* of the transistor 24 via the metal layers 87 and the right plug 27*e* is electrically connected to the diffusion layer 24*d* of the transistor 24 via the metal layers 87. Each of the metal layers 87 is provided on a side face of the plug 27*e*, forming a ring, and placed in contact with the plug 27*e* and a diffusion layer 24*c* (or 24*d*). Each of the metal layers 87 is a stacked film including, for example, a Ti (titanium) layer and a TiN film (titanium nitride film). The present example makes it possible to electrically connect each of the plugs 27*e* to the transistor 24 using a simple interconnect structure.

Figure 14A:
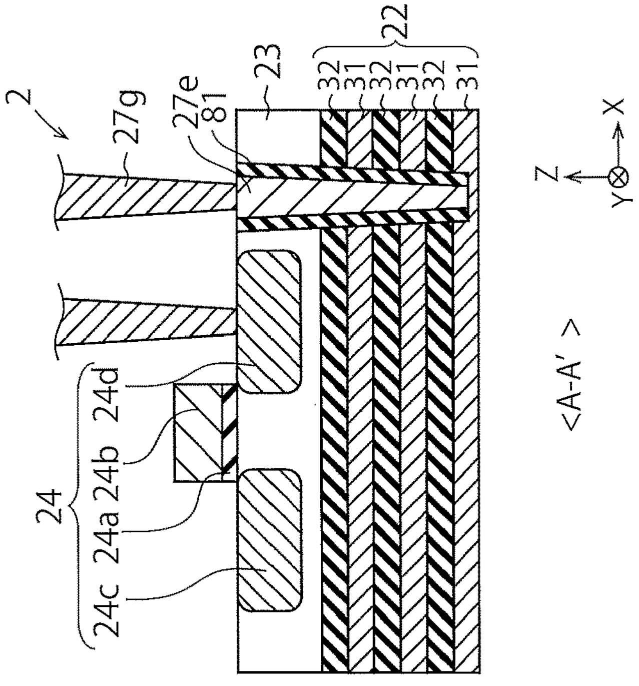
FIGS. 14A to 14C are sectional views and a plan view showing another example of the structure of the semiconductor device of the second embodiment.
Figure 14B:
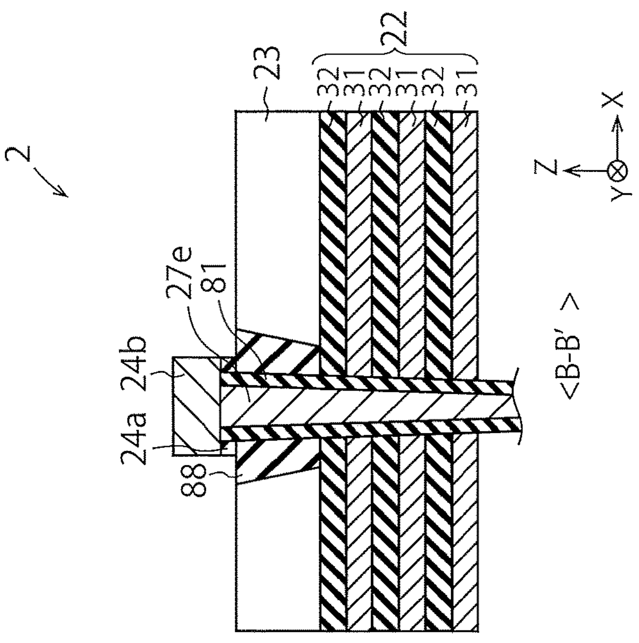
Figure 14C:
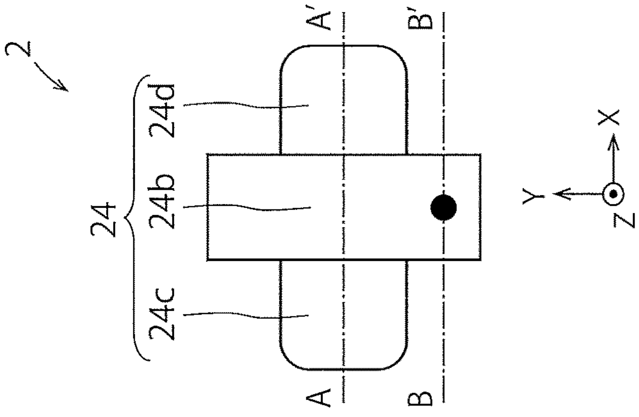

FIGS. 14A to 14C are sectional views and a plan view showing another example of the structure of the semiconductor device of the second embodiment.

FIG. 14C is a plan view showing an example of the structure of the transistor 24. FIGS. 14A and 14B show sections taken along line A-A' and line B-B', respectively, shown in FIG. 14C. FIGS. 14A and 14B show one plug 27*e* each, formed in the stacked film 22 and the substrate 23, respectively.

Hereinafter, reference sign 24*b* shown in FIG. 14C will denote an interconnect, such as "interconnect 24*b*." The interconnect 24*b* on line A-A' functions as a gate electrode of the transistor 24. On the other hand, the interconnect 24*b* on line B-B' functions as a routing interconnect that supplies a signal to the gate electrode of the transistor 24. The black dot on line B-B' shown in FIG. 14C indicates position of the plug 27*e* shown in FIG. 14B.

FIG. 14B shows an isolation insulator 88 provided in the substrate 23. The plug 27*e* shown in FIG. 14B is provided in the substrate 23 via the isolation insulator 88 and placed in contact with the lower face of the interconnect 24*b*. The present example makes it possible to electrically connect each of the plugs 27*e* to the transistor 24 using a simple interconnect structure.

FIGS. 15A to 17B are sectional views showing an example of the method of manufacturing the semiconductor device of the second embodiment. Specifically, FIGS. 15A to 17B show steps of forming the transistor 24 and plugs 27*e* shown in FIG. 13B.

Figure 15A:
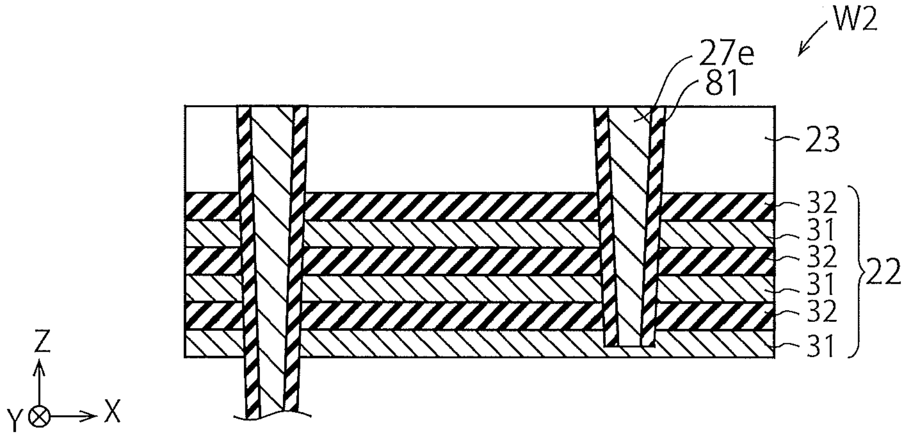
FIGS. 15A to 17B are sectional views showing an example of the method of manufacturing the semiconductor device of the second embodiment.

First, the circuit wafer W1 (not shown) and the array wafer W2 are bonded, then, plural contact holes are formed in the substrate 23 and the stacked film 22, and plural plugs 27*e* are formed in the contact holes via the insulator 81 (FIG. 15A).

Figure 15B:
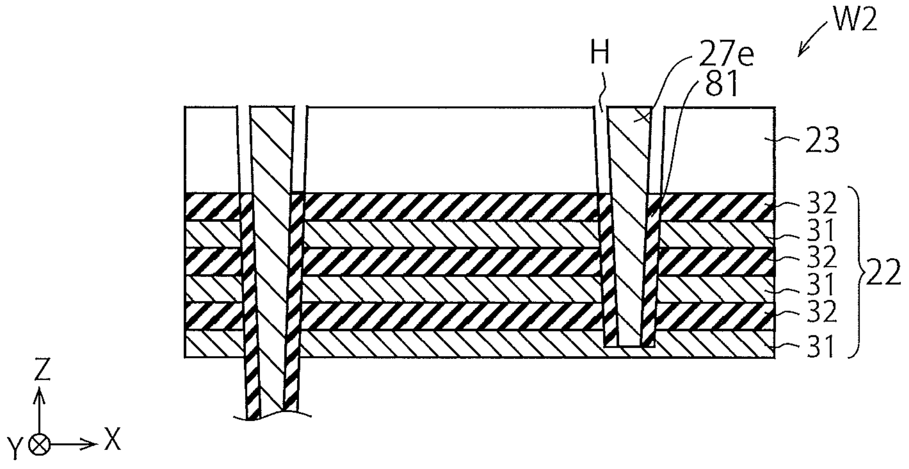

Next, the insulator 81 in the substrate 23 is removed by etching (FIG. 15B). As a result, plural ring-shaped openings H are formed between the substrate 23 and the plugs 27*e*. The etching is, for example, wet etching using a dilute aqueous solution of hydrofluoric acid.

Figure 16A:
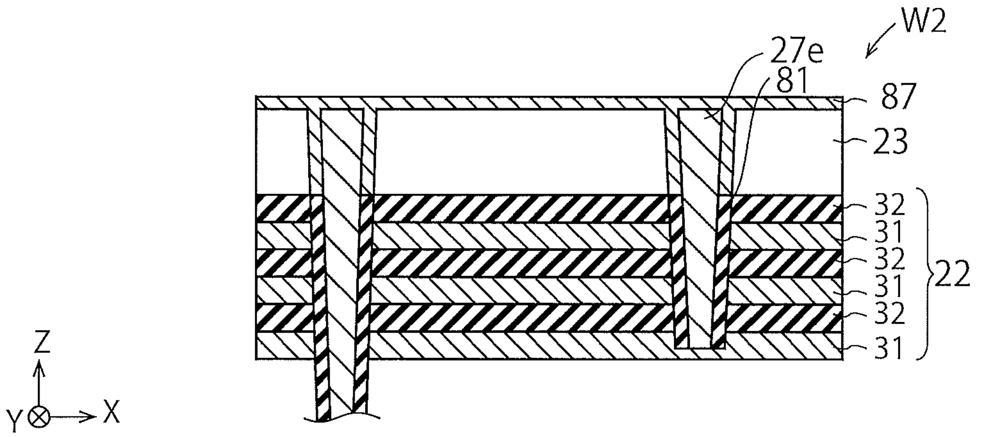

Next, the metal layer 87 is formed on an entire surface of the substrate 23 (FIG. 16A). As a result, the metal layer 87 is formed in the openings H and on the upper face of the substrate 23.

Figure 16B:
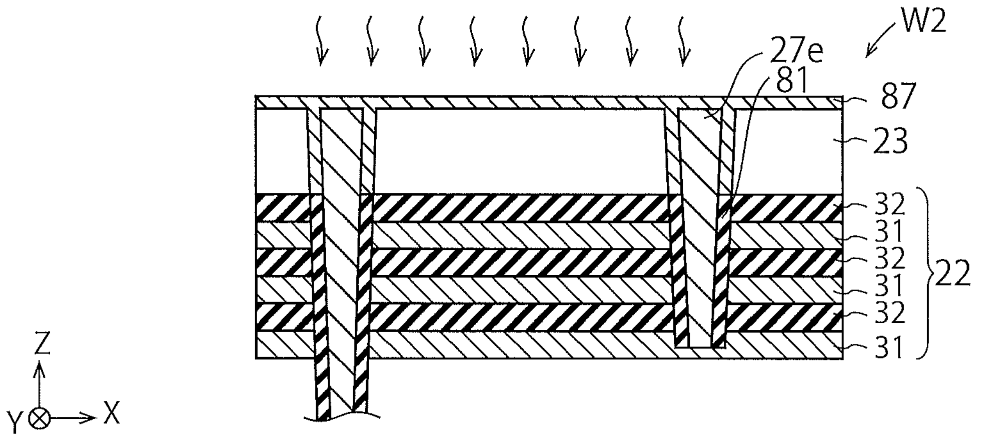

Next, the substrate 23 and the metal layer 87 are annealed (FIG. 16B). The annealing is done, for example, at 550 degrees C. As a result, that part of the substrate 23 which is near the metal layer 87 changes, for example, from silicon to metal silicide (e.g., titanium silicide).

Figure 17A:
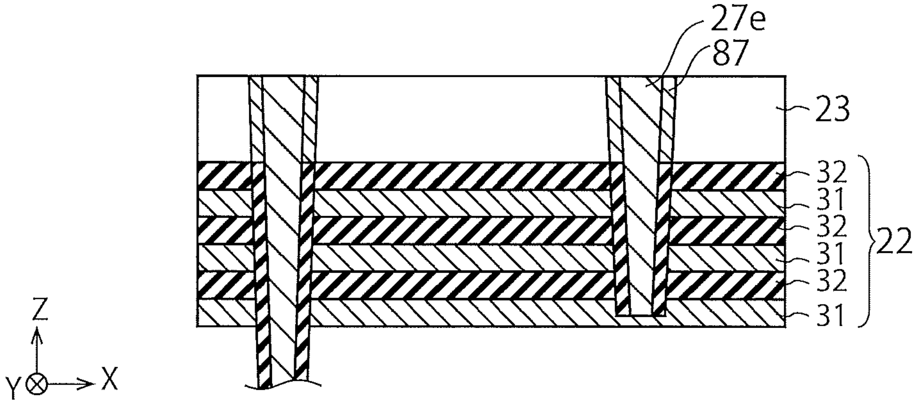

Next, that part of the metal layer 87 which is in the openings H is removed (FIG. 17A). As a result, the upper face of the substrate 23 is exposed again.

Figure 17B:
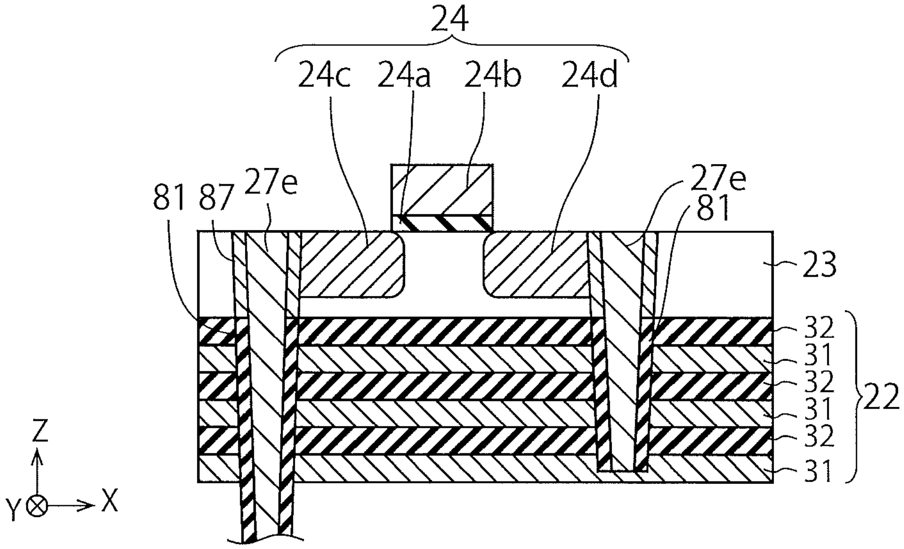

Next, the gate insulator 24*a* and the gate electrode 24*b* are formed in order on the substrate 23 and the diffusion layers 24*c* and 24*d* are formed in order in the substrate 23 (FIG. 17B). As a result, the transistor 24 is formed on the upper face of the substrate 23. The diffusion layers 24*c* and 24*d* are formed, sandwiching the gate electrode 24*b*, in such a way as to be in contact with the metal layer 87.

Figure 18:
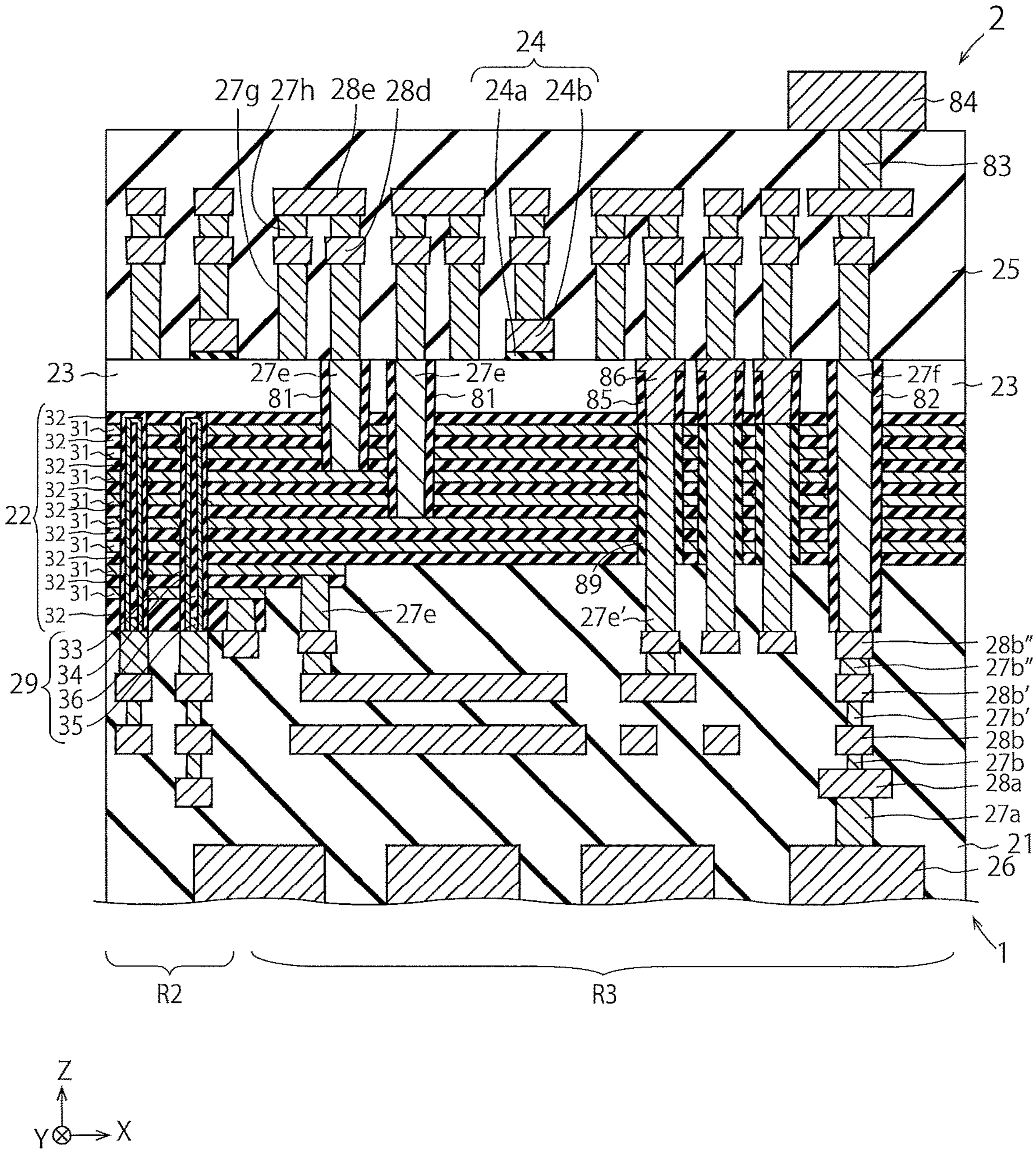
FIG. 18 is a sectional view showing a structure of a semiconductor device of a variation of the second embodiment.

FIG. 18 is a sectional view showing a structure of a semiconductor device of a variation of the second embodiment.

The semiconductor device of the present variation (FIG. 18) has a structure similar to the structure of the semiconductor device of the second embodiment (FIG. 11). However, the shape of a stacked film 22 of the present variation differs from the shape of the stacked film 22 of the second embodiment.

As shown in FIG. 18, the stacked film 22 of the present variation has a structure made up of a combination of a staircase structure and a non-staircase structure. Specifically, the first to sixth electrode layers 31 from the top has a non-staircase structure and the seventh and eighth electrode layers 31 from the top has a staircase structure. The first to sixth electrode layers 31 from the top include, for example, word lines WL and a source-side selection line SGS (see FIG. 2). The seventh and eighth electrode layers 31 from the top include, for example, a drain-side selection line SGD (see FIG. 2).

In FIG. 18, some of the plugs 27*e* are placed on the top side of the stacked film 22 as with FIG. 11 and the remaining plugs 27*e* are placed on the underside of the stacked film 22 as with FIG. 12. Each of the former plugs 27*e* is electrically connected to any of the first to sixth electrode layers 31 from the top and each of the latter plugs 27*e* is electrically connected to any of the seventh and eighth electrode layers 31 from the top. FIG. 18 further shows the plug 27*e*', the insulator 85, and the interconnect layer 86 as with FIG. 12. However, the plug 27*e*' shown in FIG. 18 is provided in the stacked film 22 via an insulator 89.

When plugs 27*e* are placed on the top side of the stacked film 22, the plugs 27*e* may not be able to be placed properly on the electrode layers 31 located near the lower face of the stacked film 22. This is because the contact holes for such plugs 27*e* will become deep. For example, the plug 27*e* that should be placed on the seventh electrode layer 31 from the top might be placed on the eighth electrode layer 31 from the top.

Consequently, according to the present variation, the plugs 27*e* for electrode layers 31 located near the lower face of the stacked film 22 are placed on the underside rather than on the top side of the stacked film 22. For example, the plugs 27*e* for the seventh and eighth electrode layers 31 from the top are placed on the underside of the stacked film 22. This makes it easy to place the plugs 27*e* properly.

As described above, the semiconductor device of the present embodiment includes the transistors 12 on the substrate 11 for the circuit chip 1 and the transistors 24 on the substrate 23 for the array chip 2. Therefore, the present embodiment makes it possible to suitably reduce the area of the semiconductor device (semiconductor chip). Furthermore, by placing at least some of the plugs 27*e* on the top side of the stacked film 22, the present embodiment makes it easy to electrically connect the electrode layers 31 and the transistors 24 with each other.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:

a first substrate;

a first device layer including a first transistor provided on an upper face of the first substrate, and a first pad;

a memory cell array layer including a memory cell array provided above the first transistor, and a second pad;

a second substrate provided above the memory cell array layer; and a second device layer including a second transistor provided on an upper face of the second substrate, wherein the second pad is directly jointed to the first pad, and the second substrate includes a lower face provided on a opposite side of the upper face of the second substrate, the second device layer being provided on a side of the upper face of the second substrate, the memory cell array layer being provided on a side of the lower face of the second substrate.

2. The device of claim 1, wherein a thickness of the second substrate is larger than a thickness of the first substrate.

3. The device of claim 1, wherein a gate insulator of the first transistor has a first thickness or a second thickness larger than the first thickness, and a gate insulator of the second transistor has the second thickness.

4. The device of claim 1, further comprising a circuit configured to control the memory cell array, wherein the circuit includes the first transistor and the second transistor.

5. The device of claim 1, wherein the second substrate includes a first well extending from the upper face to the lower face of the second substrate, and the second transistor is provided on the first well.

6. The device of claim 5, further comprising a first plug that is in contact with the lower face of the second substrate and located below the first well.

7. The device of claim 1, further comprising an isolation insulator provided in the second substrate and penetrating the second substrate.

8. The device of claim 1, further comprising a second plug penetrating the second substrate.

9. The device of claim 8, wherein the memory cell array includes a plurality of electrode layers spaced away from one another, and the second plug is electrically connected to a semiconductor layer that penetrates the plurality of electrode layers.

10. The device of claim 8, wherein the second plug is electrically connected to the first transistor.

11. The device of claim 8, wherein the second plug is electrically connected to a bonding pad provided above the second substrate.

12. The device of claim 8, wherein the memory cell array includes a plurality of electrode layers spaced away from one another, and the second plug is electrically connected to a first electrode layer out of the plurality of electrode layers.

13. The device of claim 12, wherein the second plug penetrates a second electrode layer out of the plurality of electrode layers.

14. The device of claim 12, wherein a second electrode layer is located between the second substrate and the first electrode layer.

15. The device of claim 12, further comprising a metal layer that is in contact with a side face of the second plug and a side face of a diffusion layer for the second transistor.

16. The device of claim 12, wherein the second plug is in contact with a lower face of an interconnect that includes a gate electrode of the second transistor, at a position other than the gate electrode.

17. The device of claim 12, wherein the plurality of electrode layers includes a portion having a staircase structure.

18. A method of manufacturing a semiconductor device, comprising:

forming a first device layer on a first substrate, the first device layer including a first transistor and a first pad;

forming a memory cell array layer above the first transistor, the memory cell array layer including a memory cell array and a second pad;

bonding a second substrate with the first substrate via the first device layer and the memory cell array layer; and forming a second device layer on the second substrate after the bonding, the second device layer including a second transistor, wherein the second pad is directly jointed to the first pad, and the second substrate includes a first face, and a second face provided on a opposite side of the first face, the second device layer being provided on a side of the first face of the second substrate, the memory cell array layer being provided on a side of the second face of the second substrate.

19. The method of claim 18, wherein the first transistor and the second transistor are included in a circuit configured to control the memory cell array.

20. The method of claim 18, further comprising:

forming a plug that penetrates the second substrate, after the bonding; and forming a metal layer on a side face of the plug in the second substrate, wherein a diffusion layer for the second transistor is formed in contact with the metal layer in the second substrate.

* * * * *